(12) United States Patent
Ide et al.

(10) Patent No.: US 8,952,525 B2
(45) Date of Patent: Feb. 10, 2015

(54) SEMICONDUCTOR MODULE AND METHOD FOR MANUFACTURING SEMICONDUCTOR MODULE

(75) Inventors: Eiichi Ide, Hitachi (JP); Takeshi Tokuyama, Hitachi (JP); Nobutake Tsuyuno, Naka-gun (JP); Kinya Nakatsu, Hitachinaka (JP); Tokihito Suwa, Hitachinaka (JP); Yuujiro Kaneko, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 13/983,291
(22) PCT Filed: Mar. 4, 2011
(86) PCT No.: PCT/JP2011/055082
§ 371 (c)(1),
(2), (4) Date: Aug. 1, 2013
(87) PCT Pub. No.: WO2012/120594
PCT Pub. Date: Sep. 13, 2012

(65) Prior Publication Data
US 2014/0197532 A1 Jul. 17, 2014

(51) Int. Cl.
*H01L 23/367* (2006.01)
*H01L 21/52* (2006.01)
(Continued)

(52) U.S. Cl.
CPC ............ *H01L 23/3675* (2013.01); *H01L 23/36* (2013.01); *H01L 23/42* (2013.01);
(Continued)

(58) Field of Classification Search
CPC ..... H01L 21/52; H01L 23/3107; H01L 23/34; H01L 23/3675; H01L 23/36

USPC .......... 257/706, 717, E23.101, E23.105, 719
See application file for complete search history.

(56) References Cited

U.S. PATENT DOCUMENTS

2001/0033477 A1* 10/2001 Inoue et al. .................... 361/718
2011/0037179 A1*  2/2011 Limaye et al. ................. 257/778
(Continued)

FOREIGN PATENT DOCUMENTS

| JP | 2005-57212 A | 3/2005 |
| JP | 2010-110143 A | 5/2010 |
| JP | 2010-258315 A | 11/2010 |

OTHER PUBLICATIONS

Corresponding International Search Report with English Translation dated May 31, 2011 (three (3) pages).

*Primary Examiner* — Long K Tran
*Assistant Examiner* — Jordan Klein
(74) *Attorney, Agent, or Firm* — Crowell & Moring LLP

(57) ABSTRACT

A semiconductor module includes a case including a receiving space that is formed by a frame portion and a pair of wall portions disposed to face each other with the frame portion therebetween. The wall portion includes a heat-dissipation portions and a support wall that supports the heat-dissipation portions at the frame portion, and the wall portion includes a heat-dissipation portion and a support wall that supports the heat-dissipation portion at the frame portion. The heat-dissipation portions provided at the wall portion are separately provided by being disposed to face a plurality of semiconductor device blocks respectively. A plurality of separate heat-dissipation portions is surrounded by the support wall, the support wall is deformed to recessed from the frame portion through the separate heat-dissipation portions inside the case such that a plurality of insulating sheets is closely joined to a plurality of lead frames and the plurality of heat-dissipation portions.

8 Claims, 32 Drawing Sheets

(51) Int. Cl.
　　*H01L 23/36*　　(2006.01)
　　*H01L 23/42*　　(2006.01)
　　*H01L 23/495*　　(2006.01)
　　*H01L 23/433*　　(2006.01)
　　H01L 23/31　　(2006.01)
　　H01L 23/00　　(2006.01)
　　H01L 23/373　　(2006.01)

(52) U.S. Cl.
　　CPC ........ *H01L23/49575* (2013.01); *H01L 23/433* (2013.01); *H01L 21/52* (2013.01); *H01L 2224/48091* (2013.01); *H01L 2224/73265* (2013.01); *H01L 2924/13055* (2013.01); *H01L 2924/13091* (2013.01); *H01L 2224/40137* (2013.01); *H01L 2224/32245* (2013.01); *H01L 2224/33181* (2013.01); *H01L 2224/48247* (2013.01); *H01L 2224/73221* (2013.01); *H01L 2224/40247* (2013.01); *H01L 23/3107* (2013.01); *H01L 24/32* (2013.01); *H01L 24/33* (2013.01); *H01L 24/40* (2013.01); *H01L 24/45* (2013.01); *H01L 24/48* (2013.01); *H01L 24/73* (2013.01); *H01L 2224/45124* (2013.01); *H01L 2224/45144* (2013.01); *H01L 23/3735* (2013.01); *H01L 2924/30107* (2013.01); *H01L 2924/3025* (2013.01)
　　USPC ............ 257/706; 257/717; 257/719; 438/107

(56) References Cited

U.S. PATENT DOCUMENTS

2011/0299265 A1　　12/2011　Nakatsu et al.
2012/0087095 A1*　　4/2012　Tokuyama et al. ........... 361/721
2012/0300522 A1*　　11/2012　Tokuyama et al. ........... 363/131
2013/0328185 A1*　　12/2013　Hiramitsu et al. ............ 257/719

* cited by examiner

FIG. 20
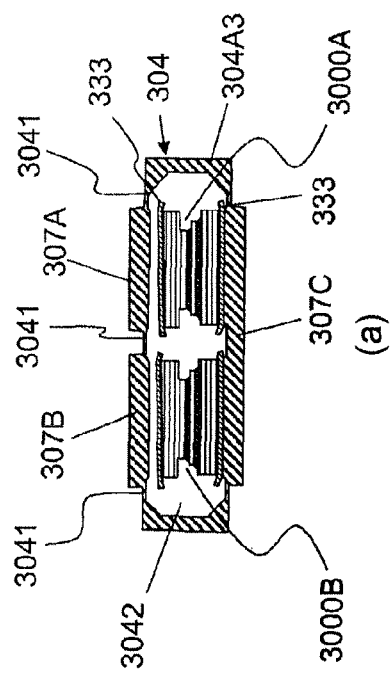
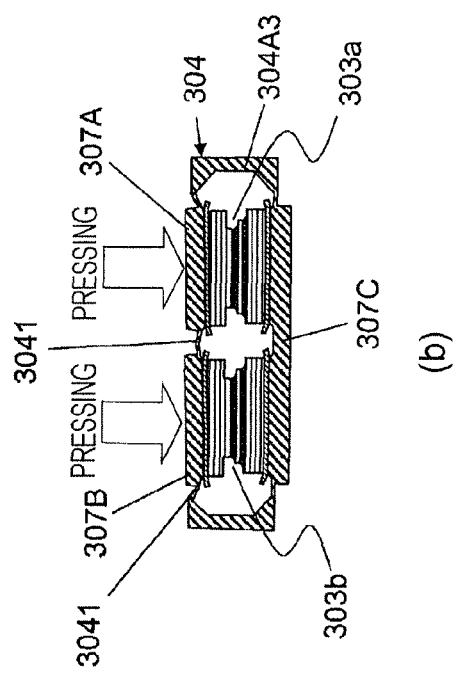

FIG. 25
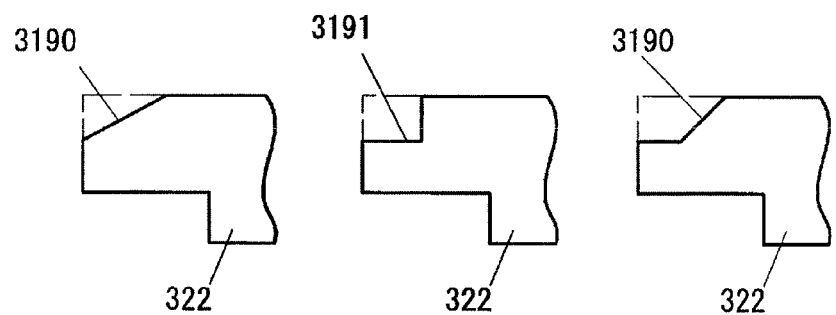
(a)
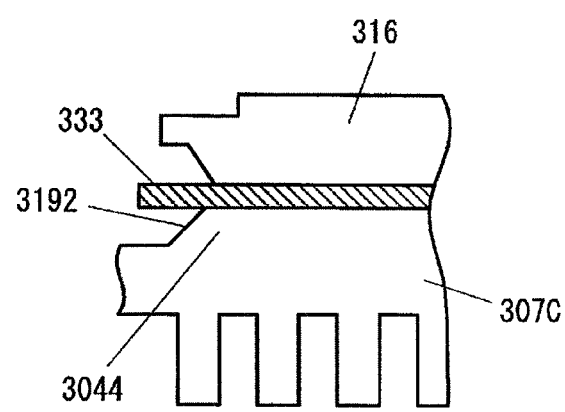
(b)

SEMICONDUCTOR MODULE AND METHOD FOR MANUFACTURING SEMICONDUCTOR MODULE

TECHNICAL FIELD

The present invention relates to a double-sided cooling semiconductor module that performs cooling from both sides of a semiconductor device, and a method for manufacturing the semiconductor module.

BACKGROUND ART

Recently, an electric vehicle driven by a motor and a hybrid vehicle driven by a combination of a motor and an engine have been attracting attention from the viewpoint of energy conservation. A high-capacity in-vehicle motor mounted on these vehicles is difficult to drive and control by a DC voltage of a battery, and a power converter using the switching of a power semiconductor chip is essential for boosting and AC control.

The power semiconductor chip used in the power converter requires a high heat dissipation capacity because it is heated by energization. A technology of PTL 1 describes a power semiconductor device that can be received in a case according to the thickness of an insulating spacer by forming the case into a CAN shape and providing a deformation portion, even when there is a thickness variation in a stack of a positive side terminal and a negative side terminal.

CITATION LIST

Patent Literature

PTL 1: JP 2010-110143 A

SUMMARY OF INVENTION

Technical Problem

A structure described in PTL 1 has a problem in that when a plurality of conductive plates mounted with the power semiconductor device in the case is embedded in the case in parallel through an insulating layer, a non-adhesive portion is formed or the thickness of the insulating layer varies due to a variation in the parallelism between members, thus degrading an insulation performance and a heat resistance cycle performance.

Solution to Problem

According to a first aspect of the invention, a semiconductor module includes: a case including a receiving space which is formed by a frame portion and a pair of wall portions disposed to face each other with the frame portion therebetween, the pair of wall portions including a heat dissipation portion and a support wall which supports the heat dissipation portion at the frame portion; a plurality of semiconductor device blocks which are disposed in parallel in the receiving space while facing the wall portion, wherein a conductor plate is joined to each of electrode surfaces formed at both sides of a semiconductor device; a plurality of insulating sheet members which are respectively interposed between the respective conductor plates and an inner periphery of the wall portion to insulate the respective conductor plates and the inner periphery of the wall portion; and a resin composition member which is filled in the receiving space to seal the plurality of semiconductor device blocks, wherein the heat dissipation portion provided at least one side of the wall portion includes a plurality of separate heat dissipation portions disposed to face the plurality of semiconductor device blocks respectively, and the plurality of separate heat dissipation portions is surrounded by the support wall, the support wall is deformed to recessed from the frame portion through the separate heat dissipation portion inside the case such that the plurality of insulating sheet members is closely joined to the plurality of conductor plates and the plurality of separate heat dissipation portions respectively.

According to a second aspect of the invention, in the semiconductor module according to the first aspect, the conductor plate may include a connection portion which is bent and formed a semiconductor device side and is connected to the conductor plate of the other semiconductor device blocks disposed in parallel.

According to a third aspect of the invention, in the semiconductor module according to the first or second aspect, the conductor plate has an inclined surface or an uneven surface formed at an end portion of a surface facing the insulating sheet member, and the resin composition member is filled into a gap between the inclined surface or the uneven surface and the insulating sheet member.

According to a fourth aspect of the invention, in the semiconductor module according to any one of the first to third aspects, it is preferable that a thermal conductivity of the insulating sheet member is higher than a thermal conductivity of the resin composition member.

According to a fifth aspect of the invention, in the semiconductor module according to any one of the first to fourth aspects, it is preferable that a polyamide resin layer is formed between the semiconductor device block, the insulating sheet member, the inner periphery of the case, and the resin composition member.

According to a sixth aspect of the invention, in the semiconductor module according to any one of the first to fifth aspects, it is preferable that the semiconductor module includes a position determining unit which determines a position of the plurality of semiconductor device blocks in the receiving space.

According to a seventh aspect of the invention, a method for manufacturing the semiconductor module according to the first aspect includes: fixing the insulating sheet member to the conductor plate provided in the semiconductor device block; disposing the plurality of semiconductor device blocks, to which the insulating sheet member is fixed, in parallel in the receiving space such that the insulating sheet member faces the corresponding separate heat dissipation portion; pressing each of the separate heat dissipation portions toward the inside of the case to deform the support wall and join the separate heat dissipation portion closely to the insulating sheet member; and filling the resin composition member into the receiving space to seal the plurality of semiconductor device blocks.

According to an eighth aspect of the invention, in the method for manufacturing the semiconductor module according to the seventh aspect, after deforming the support wall and joining the separate heat dissipation portion closely to the insulating sheet member, the polyamide resin layer is formed by attaching a polyamide resin to the inner periphery of the case and the plurality of semiconductor device blocks received in the receiving space, and the plurality of semiconductor device blocks is sealed by filling the resin composition member into the receiving space.

Advantageous Effects of Invention

The invention can improve the insulation performance and the heat dissipation performance of a semiconductor module.

BRIEF DESCRIPTION OF DRAWINGS

FIG. 13 is a perspective view illustrating an external appearance of a power module 300a.
FIG. 20 is a cross-sectional view illustrating the semiconductor device unit 3000 inserted into a case 304.
FIG. 25 is an enlarged view of an end portion of a lead frame.

DESCRIPTION OF EMBODIMENTS

Hereinafter, embodiments of the invention will be described with reference to the drawings. A semiconductor module according to this embodiment can be applied, for example, to a power converter mounted on a hybrid vehicle and an electric vehicle, a power converter of an electric train, a ship, an aircraft and the like, an industrial power converter used as a controller of a motor driving a plant equipment, or a home power converter used in a controller of a motor driving a home solar power system and a home electric appliance. Hereinafter, the case of application to a power converter of the hybrid vehicle will be described as an example.

Figure 1:
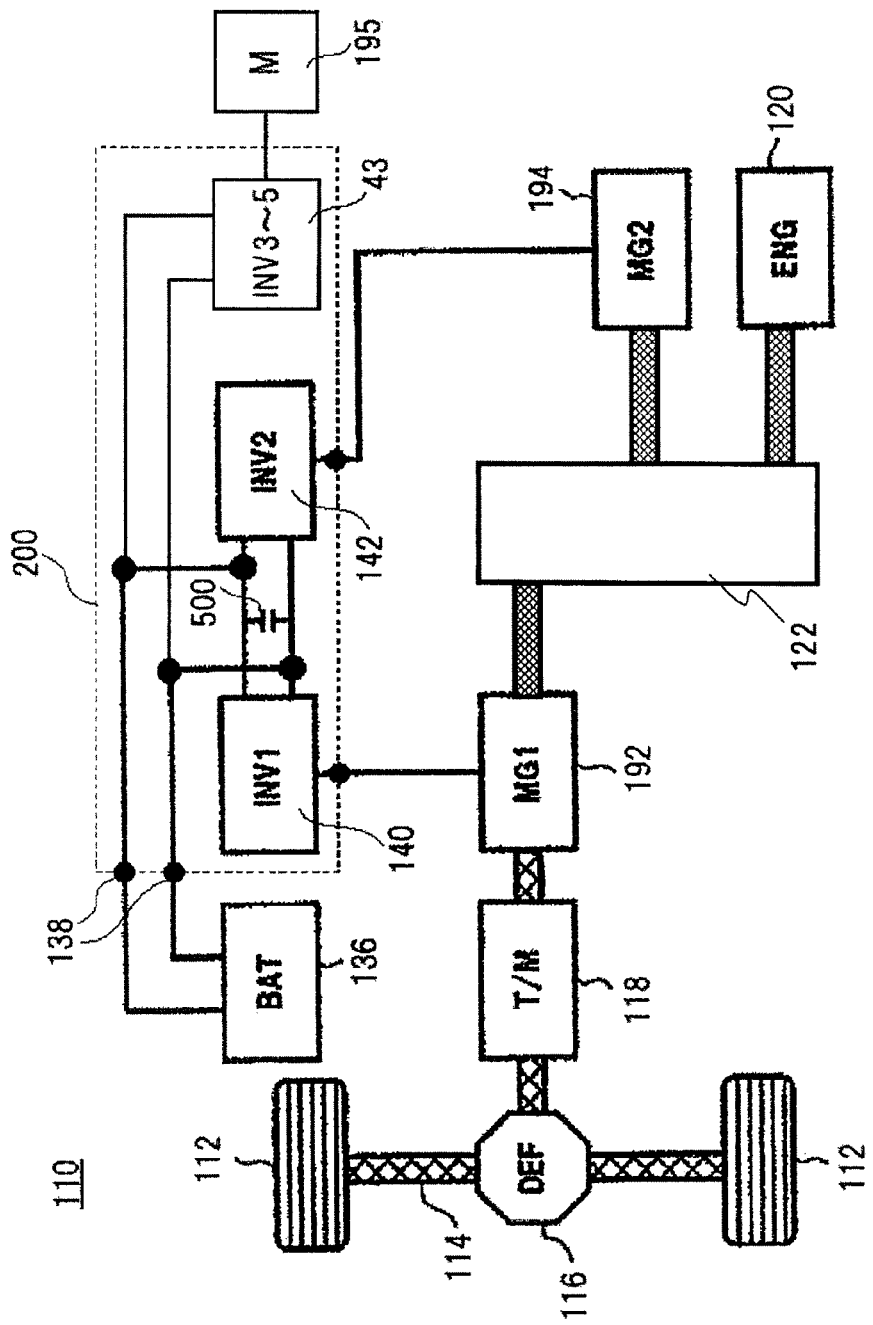
FIG. 1 is a diagram illustrating a control block of a hybrid vehicle.

FIG. 1 is a diagram illustrating a control block of the hybrid vehicle. In FIG. 1, a hybrid electric vehicle (hereinafter referred to as "HEV") 110 is one motor vehicle and includes two vehicle drive systems. One of the two vehicle drive systems is an engine system that uses an engine (internal combustion engine) 120 as a power source. The engine system is mainly used as a drive source of the HEV. The other one of the two vehicle drive systems is an in-vehicle electric system that uses motor generators 192 and 194 as a power source. The in-vehicle electric system is mainly used as a drive source of the HEV and a power generation source of the HEV. The motor generators 192 and 194 are, for example, synchronous machines or induction machines. Since it operates as a generator and a motor according to operation methods, it is herein referred to as a motor generator.

A front wheel axle 114 is rotatably supported by a front portion of a vehicle body, and a pair of front wheels 112 is provided at both ends of the front wheel axle 114. A rear wheel axle is rotatably supported by a rear portion of the vehicle body, and a pair of rear wheels is provided at both ends of the rear wheel axle (not illustrated). The HEV of this embodiment adopts a so-called front-wheel drive scheme, but may also adopt a rear-wheel drive scheme. A front wheel side differential gear (hereinafter referred to as "front wheel side DEF") 116 is provided at a center portion of the front wheel axle 114. An output side of a transmission 118 is mechanically connected to an input side of the front wheel side DEF 116. An output side of the motor generator 192 is mechanically connected to an input side of the transmission 118. An output side of the engine 120 and an output side of a motor generator 194 are mechanically connected to an input side of the motor generator 192 through a power distribution mechanism 122.

Inverter units 140 and 142 are electrically connected to a battery 136 through a DC connector 138. Power transfer is possible between the battery 136 and inverter units 140 and 142. In this embodiment, a first motor generation unit including the motor generator 192 and the inverter unit 140 and a second motor generation unit including the motor generator 194 and the inverter unit 142 are provided, and the first motor generation unit and the second motor generation unit are used discriminatively according to operation states. Further, in this embodiment, by operating the first motor generation unit as a motor unit by the power of the battery 136, the vehicle can be driven just by the power of the motor generator 192. In addition, in this embodiment, the battery 136 can be charged by operating the first motor generation unit or the second motor generation unit as a generation unit by the power of the engine 120 or the power from the wheels.

The battery 136 is also used as a power source for driving an auxiliary motor 195. The auxiliary motor is, for example, a motor driving a compressor of an air conditioner, or a motor driving a hydraulic pump for control. DC power is supplied from the battery 136 to an inverter unit 43, the DC power is converted into AC power by the inverter unit 43, and the AC power is supplied to the motor 195. The inverter unit 43 has the same function as the inverter units 140 and 142, and controls the AC phase, frequency and the power supplied to the motor 195. Since the capacity of the motor 195 is smaller than the capacity of the motor generators 192 and 194, the maximum conversion power of the inverter unit 43 is smaller than the maximum conversion power of the inverter units 140 and 142. However, the circuit configuration of the inverter unit 43 is basically the same as the circuit configuration of the inverter units 140 and 142. Further, the power converter 200 includes a capacitor module 500 for smoothing a DC current supplied to the inverter unit 140, the inverter unit 142, and the inverter unit 43.

An electric circuit configuration of the inverter unit 140 and the inverter unit 142 or the inverter unit 43 will be described with reference to FIG. 2. Further, in FIG. 2, the inverter unit 140 will be described as a representative example.

An inverter circuit 144 includes an upper/lower arm series circuit 150 that includes an IGBT 155 and a diode 156 operating as an upper arm and an IGBT 157 and a diode 158 operating a lower arm, which provides three phases (phase U, phase V, and phase W) corresponding to each phase winding wire of an armature winding wire of the motor generator 192. The each upper/lower arm series circuit 150 is connected from its midpoint portion (intermediate electrode 329) through an AC connector 188 and an AC terminal 159 to an AC power line (AC bus bar) 186 to the motor generator 192.

A collector electrode 153 of the IGBT 155 of the upper arm is electrically connected through a positive terminal (P terminal) 167 to a capacitor electrode of the positive side of the capacitor module 500, and an emitter electrode of the IGBT 157 of the lower arm is electrically connected through a negative terminal (N terminal) 166 to a capacitor electrode of the negative side of the capacitor module 500.

A control unit 170 includes a driver circuit 174 for drive-controlling the inverter circuit 144, and a control circuit 172 for supplying a control signal to the driver circuit 174 through a signal line 176. The IGBT 155 and the IGBT 157 operate in response to a drive signal output from the control unit 170, and convert the DC power supplied from the battery 136 into three-phase AC power. The three-phase AC power is supplied to the armature winding wire of the motor generator 192.

The IGBT 155 includes a collector electrode 153, a signal emitter electrode 151, and a gate electrode 154. Further, the IGBT 157 includes a collector electrode 163, a signal emitter electrode 165, and a gate electrode 164. The diode 156 is electrically connected in parallel to the IGBT 155. Further, the diode 158 is electrically connected in parallel to the IGBT 157. A MOSFET (Metal Oxide Semiconductor Field Effect Transistor) may be used as a switching power semiconductor device, but the diode 156 and the diode 158 are unnecessary in this case. The capacitor module 500 is electrically connected to a positive side capacitor terminal 506 and a negative side capacitor terminal 504 through the DC connector 138. Further, the inverter unit 140 is connected through a DC positive terminal 314 to the positive side capacitor terminal 506, and is connected through a DC negative terminal 316 to the negative side capacitor terminal 504.

The control circuit 172 includes a microcomputer (hereinafter referred to as "microcomputer") for calculating the switching timing of the IGBT 155 and the IGBT 157. As input information, a target torque required for the motor generator 192, a current value supplied from the upper/lower arm series circuit 150 to the armature winding wire of the motor generator 192, and a magnetic pole position of a rotor of the motor generator 192 are input to the microcomputer. The target torque value is based on a command signal output from an upper controller (not illustrated). The current value is detected based on a detection signal that is output from a current sensor 180 through a signal line 182. The magnetic pole position is detected based on a detection signal that is output from a rotating magnetic pole sensor (not illustrated) provided in the motor generator 192. In this embodiment, although the case of detecting a three-phase current value is described as an example, a two-phase current value may be detected.

The microcomputer in the control circuit 172 calculates a d/q-axis current command value of the motor generator 192 based on the target torque value, calculates a d/q-axis voltage command value based on the difference between the calculated d/q-axis current command value and a detected d/q-axis current value, and converts the calculated d/q-axis voltage command value into a U/V/W phase voltage command value based on the detected magnetic pole position. The microcomputer generates a pulsed modulation wave based on the comparison between a fundamental wave (sinusoidal wave) and a carrier wave (triangular wave) based on the U/V/W phase voltage command value, and outputs the generated modulation wave as a PWM (Pulse Width Modulation) signal to the driver circuit 174 through the signal line 176.

When driving the lower arm, the driver circuit 174 outputs a drive signal amplified from the PWM signal to the gate electrode of the IGBT 157 of the lower arm. Further, when driving the upper arm, the driver circuit 174 shifts a reference potential level of the PWM signal to a reference potential level of the upper arm, amplifies the PWM signal, and outputs the amplified PWM signal as the drive signal to the gate electrode of the IGBT 155 of the upper arm.

Further, the control unit 170 performs anomaly detection (overcurrent, overvoltage, over-temperature, or the like) to protect the upper/lower arm series circuit 150. Therefore, sensing information is input to the control unit 170. For example, information about currents flowing through the emitter electrodes of the IGBT 155 and the IGBT 157 is input from the signal emitter electrode 151 of the upper arm and the signal emitter electrode 165 of the lower arm to the corresponding drive units (IC). Accordingly, the respective drive units (IC) perform overcurrent detection, and when detecting an overcurrent, stop the switching operations of the IGBT 155 and the IGBT 157 to protect the IGBT 155 and the IGBT 157 from the overcurrent. Temperature information of the upper/lower arm series circuit 150 is input to the microcomputer from a temperature sensor (not illustrated) provided in the upper/lower arm series circuit 150. Further, voltage information of the DC positive side of the upper/lower arm series circuit 150 is input to the microcomputer. The microcomputer performs over-temperature detection and overvoltage detection based on the above information, and stops the switching operations of both the IGBT 155 and the IGBT 157 when detecting an over-temperature or an overvoltage.

Figure 3:
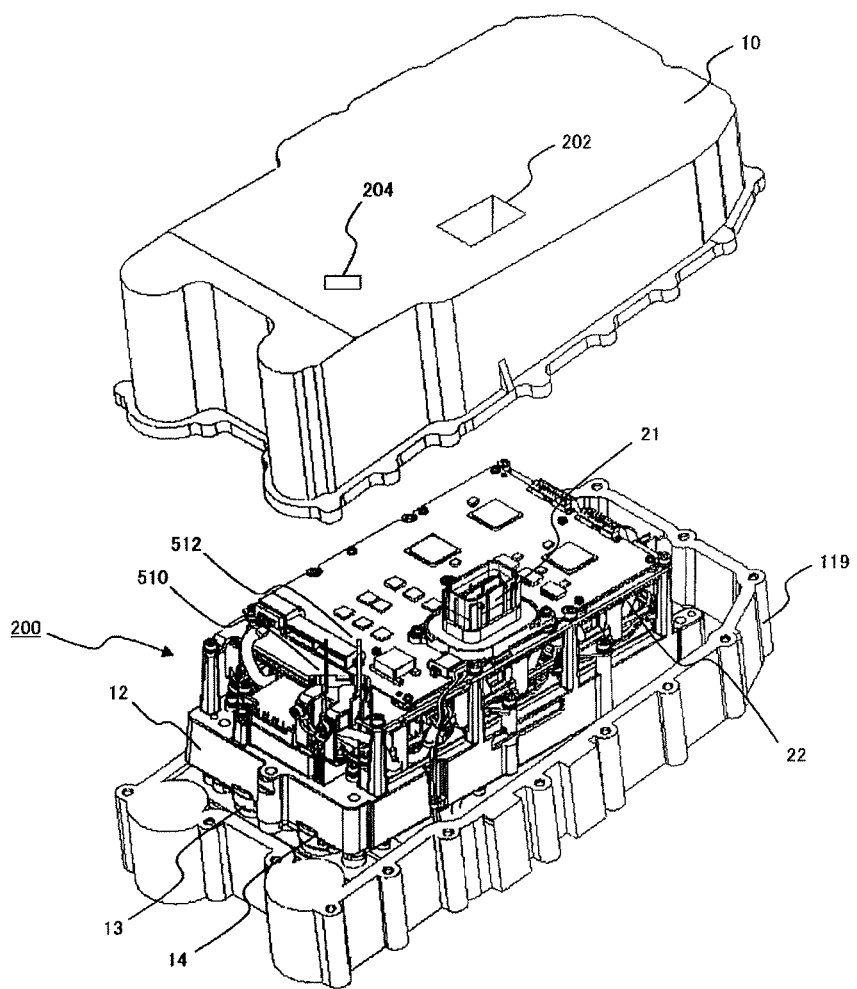
FIG. 3 is an exploded perspective view for describing an installation position of the power converter 200.

FIG. 3 is an exploded perspective view for describing the installation position of the power converter 200. The power converter 200 is fixed to a housing 119 that is formed of Al or Al alloy and receives the transmission 118. By having a generally rectangular shape of bottom side and top side, the power converter 200 is easy to attach to the vehicle and is easy to manufacture. A cooling jacket 12 is cooled by a cooling medium while holding a power module 300 and the capacitor module 500, which will be described later. Further, the cooling jacket 12 is fixed to the housing 119, and has an inlet pipe 13 and an outlet pipe 14 formed at a facing surface with respect to the housing 119. By connecting the inlet pipe 13 and the outlet pipe 14 to a pipe formed at the housing 119, a cooling medium for cooling the transmission 118 flows in/out the cooling jacket 12.

A case 10 covers the power converter 200 and is fixed to the housing 119. The bottom of the case 10 is configured to face a control circuit board 20 mounted with the control circuit 172. Further, the case 10 has a first opening 202 and a second opening 204 that are formed at the bottom of the case 10 and lead from the bottom of the case to the outside. A connector 21 is connected to the control circuit board 20, and transmits various signals from the outside to the control circuit board 20. A battery negative side connection terminal portion 510 and a battery positive side connection terminal portion 512 are configured to electrically connect the battery 136 and the capacitor module 500.

The connector 21, the battery negative side connection terminal portion 510, and the battery positive side connection terminal portion 512 extend toward the bottom side of the case 10, the connector 21 protrudes from the first opening 202, and the battery negative side connection terminal portion 510 and the battery positive side connection terminal portion 512 protrude from the second opening 204. In the case 10, a seal member (not illustrated) is provided around the first opening 202 and the second opening 204 of the inner wall thereof.

The direction of an engagement surface of a terminal such as the connector 21 varies according to vehicle models. However, in particular, when it is to be mounted on a small-sized vehicle, it may be preferable from the viewpoint of the assemblability and the restriction on the size of an engine room that the engagement direction faces upward. In particular, as in this embodiment, when the power converter 200 is disposed above the transmission 118, it protrudes toward the opposite side to the disposition side of the transmission 118, thereby improving workability. Further, although the connector 21 needs to be sealed from the external atmosphere, the case 10 is assembled to the connector 21 from the upward direction. Accordingly, when the case 10 is assembled to the housing 119, the seal member contacting the case 10 can press the connector 21, thus improving airtightness.

Figure 4:
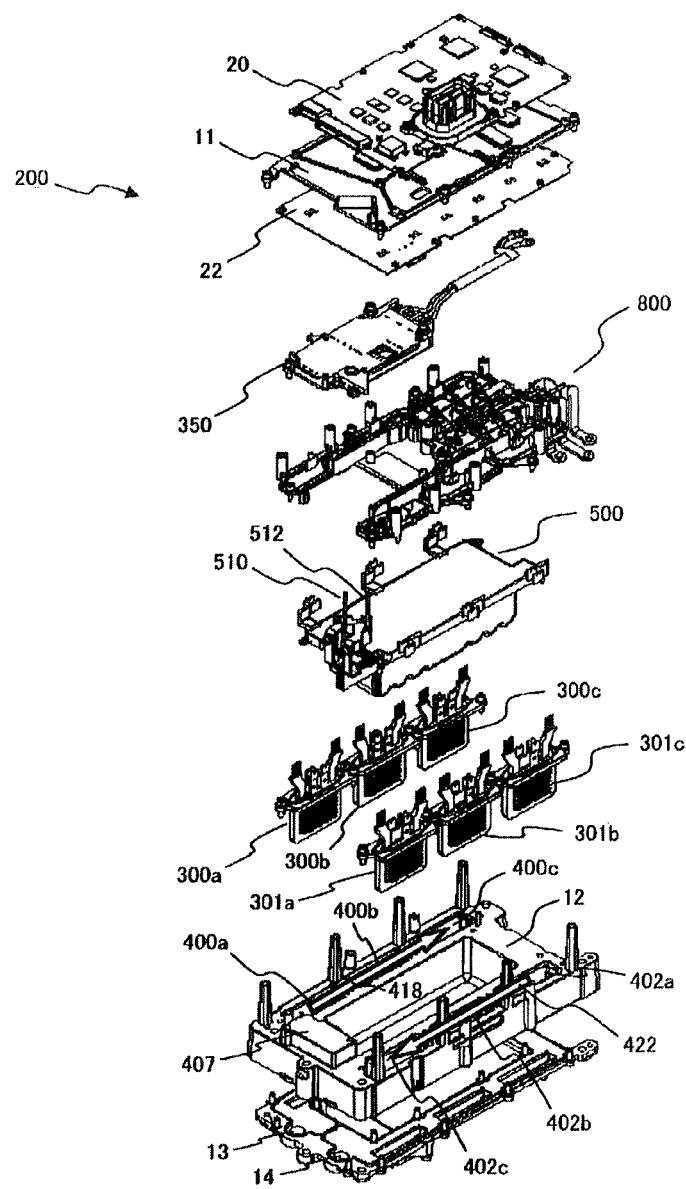
FIG. 4 is an exploded perspective view of the power converter 200.

FIG. 4 is an exploded perspective view of the power converter 200. The cooling jacket 12 is provided with a flow passage 19. At the top side of the flow passage 19, opening portions 400a to 400c are formed along a refrigerant flow direction 418, and opening portions 402a to 402c are formed along a refrigerant flow direction 422. The opening portions 400a to 400c are blocked by power modules 300a to 300c, and the opening portions 402a to 402c are blocked by power modules 301a to 301c.

Further, a receiving space 405 for receiving the capacitor module 500 is formed in the cooling jacket 12. By being received in the receiving space 405, the capacitor module 500 is cooled by the refrigerant flowing through the flow passage 19. Since the capacitor module 500 is inserted between the flow passage 19 for forming the refrigerant flow direction 418 and the flow passage 19 for forming the refrigerant flow direction 422, the capacitor module 500 can be cooled efficiently.

In the cooling jacket 12, a protrusion portion 407 is formed at a position facing the inlet pipe 13 and the outlet pipe 14. The protrusion portion 407 is formed integrally with the cooling jacket 12. An auxiliary power module 350 is fixed to the protrusion portion 407, and is cooled by the refrigerant flowing through the flow passage 19. A bus bar module 800 is disposed at the side portion of the auxiliary power module 350. The bus bar module 800 is configured by an AC bus bar 186, a current sensor 180, and the like, which will be described later in detail.

In this manner, the receiving space 405 of the capacitor module 500 is provided at a center portion of the cooling jacket 12, the flow passage 19 is inserted into the receiving space 405, the power modules 300a to 300c and the power modules 301a to 301c for driving the vehicle are disposed at the respective flow passages 19, and the auxiliary power module 350 is disposed at the top side of the cooling jacket 12, thereby making it possible to provide efficient cooling in a small space and miniaturize the entire power converter. Further, by making the main structure of the flow passage 19 of the cooling jacket 12 in integration with the cooling jacket 12 by the casting of Al or Al alloy material, the flow passage 19 can increase the mechanical strength in addition to the cooling effect. Further, by making the main structure of the flow passage 19 of the cooling jacket 12 by Al casting, the cooling jacket 12 and the flow passage 19 are integrated with each other, heat transfer is improved, and the cooling efficiency is improved.

Further, the flow passage 19 is completed by fixing the power modules 300a to 300c and the power modules 301a to 301c to the flow passage 19, and a water leakage test is performed on the flow passage. After the water leakage test is passed, the capacitor module 500, the auxiliary power module 350, and the substrate can be attached. In this manner, after the cooling jacket 12 is disposed at the bottom portion of the power converter 200, necessary components such as the capacitor module 500, the auxiliary power module 350, the bus bar module 800, and the substrate can be fixed sequentially from the top, thus improving productivity and reliability.

A driver circuit board 22 is disposed above the auxiliary power module 350 and the bus bar module 800. Further, a metal base plate 11 is disposed between the driver circuit board 22 and the control circuit board 20. The metal base plate 11 performs the electromagnetic shielding of a circuit group mounted on the driver circuit board 22 and the control circuit board 20, and dissipates and cools the heat generated by the driver circuit board 22 and the control circuit board 20.

Figure 5:
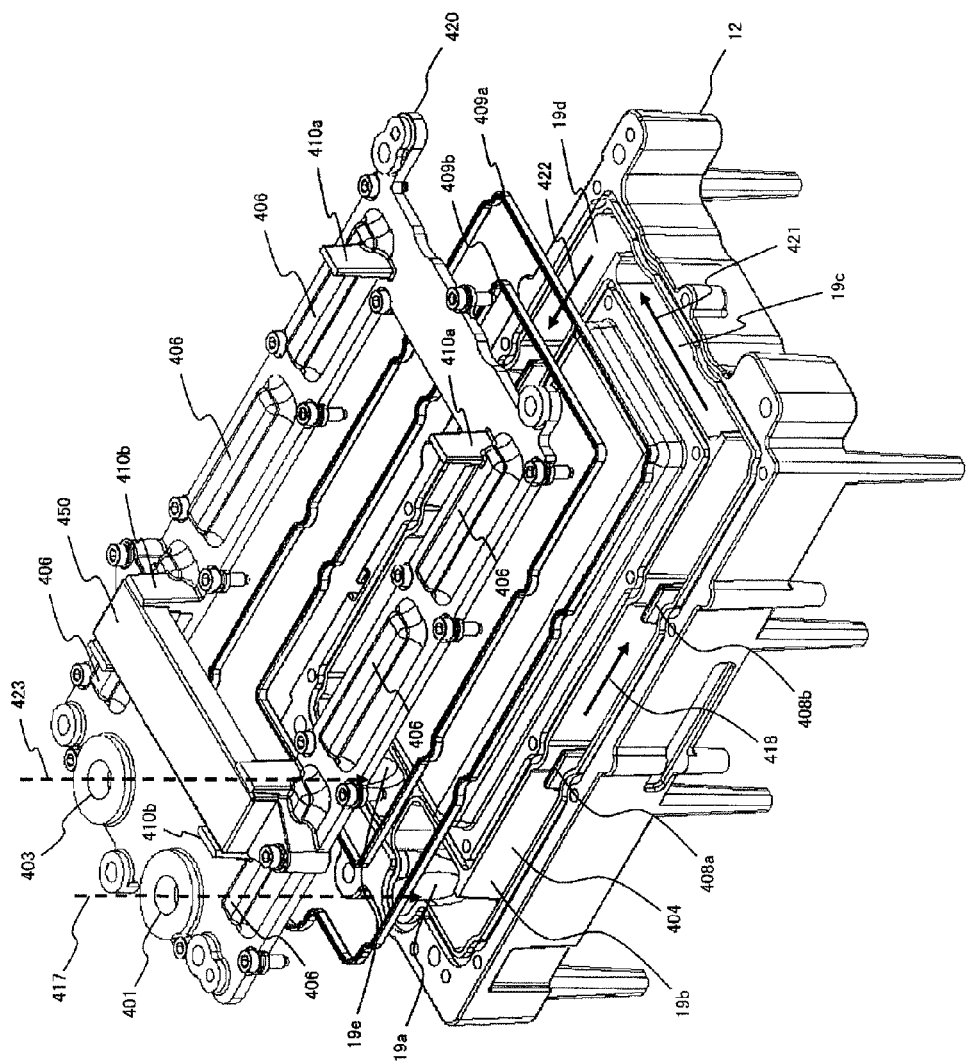
FIG. 5 is a bottom view of a cooling jacket 12.

FIG. 5 is a bottom view of the cooling jacket 12 including the flow passage 19. The cooling jacket 12 and the flow passage 19 provided in the cooling jacket 12 are cast integrally. One opening portion 404 is formed at the bottom side of the cooling jacket 12. The opening portion 404 is closed by a lower cover 420 having an opening at a center portion. A seal member 409a and a seal member 409b are provided between the lower cover 420 and the cooling jacket 12, thus maintaining the airtightness.

In the lower cover 420, an inlet hole 401 for inserting the inlet pipe 13 and an outlet hole 403 for inserting the outlet pipe 14 are formed near one end side along the end side. Further, a convex portion 406 protruding toward the disposition direction of the transmission 118 is formed at the lower cover 420. The convex portion 406 is provided at each of the power modules 300a to 300c and the power modules 301a to 301c.

In a flow direction 417, the refrigerant flows through the inlet hole 401 toward a first flow passage portion 19a formed along the lateral side of the cooling jacket 12. Then, in a flow direction 418, the refrigerant flows through a second flow passage portion 19b formed along the longitudinal side of the cooling jacket 12. Further, in a flow direction 421, the refrigerant flows through a third flow passage portion 19c formed along the lateral side of the cooling jacket 12. The third flow passage portion 19c forms a folded flow passage. Further, in a flow direction 422, the refrigerant flows through a fourth flow passage portion 19d formed along the longitudinal side of the cooling jacket 12. The fourth flow passage portion 19d is provided across the capacitor module 500 at a position facing the second flow passage portion 19b. In addition, in a flow direction 423, the refrigerant is discharged to the outlet pipe 14 through the outlet hole 403 and a fifth flow passage portion 19e formed along the lateral side of the cooling jacket 12.

All of the first flow passage portion 19a, the second flow passage portion 19b, the third flow passage portion 19c, the fourth flow passage portion 19d and the fifth flow passage portion 19e are formed to be larger in the depth direction than in the width direction. The power modules 300a to 300c are inserted from the opening portions 400a to 400c formed at the upper side of the cooling jacket 12 (see FIG. 4), and are received in a receiving space inside the second flow passage portion 19b. Further, an intermediate member 408a for preventing the standing of a refrigerant flow is formed between the receiving space of the power module 300a and the receiving space of the power module 300b. Likewise, an intermediate member 408b for preventing the standing of a refrigerant flow is formed between the receiving space of the power module 300b and the receiving space of the power module 300c. The intermediate member 408a and the intermediate member 408b are formed such that the principal surface follows the refrigerant flow direction. As in the second flow passage portion 19b, in the fourth flow passage portion 19d, an intermediate member and a receiving space of the power modules 301a to 301c are formed. Further, since the opening portion 404 and the opening portions 400a to 400c and 402a to 402c are formed to face each other, the cooling jacket 12 is easy to manufacture by aluminum casting.

The lower cover 420 is provided with a support portion 410a and a support portion 410b that abut the housing 119 and support the power converter 200. The support portion 410a is provided near one end side of the lower cover 420, and the support portion 410b is provided near the other end side of the lower cover 420. Accordingly, the power converter 200 can be tightly fixed to the sidewall of the housing 119 formed according to the circular cylindrical shape of the transmission 118 and the motor generator 192.

Further, the support portion 410b is configured to support a resistor 450. The resistor 450 is to discharge the electric charge charged in a capacitor cell, in consideration of occupant protection and safety during maintenance. The resistor 450 is configured to continuously discharge high-voltage electricity. However, the resistor 450 needs to be configured such that the damage to the vehicle is minimized even when there is some abnormality in the resistor or the discharge mechanism. That is, when the resistor 450 is disposed around the power module, the capacitor module, the driver circuit board, or the like, and when the resistor 450 causes a failure such as heating and firing, there may be a possibility of burning in the vicinity of the main component.

Therefore, in this embodiment, the power modules 300a to 300c, the power modules 301a to 301c, and the capacitor module 500 are disposed across the cooling jacket 12 at the opposite side to the housing 119 receiving the transmission 118, and the resistor 450 is disposed in the space between the cooling jacket 12 and the housing 119. Accordingly, the resistor 450 is disposed in an enclosed space surrounded by the housing 119 and the cooling jacket 12 formed of metal. Further, the electric charge stored in the capacitor cell inside the capacitor module 500 is discharged to the resistor 450, through the interconnection passing the side portion of the cooling jacket 12, by the switching operation of a switching unit mounted on the driver circuit board 22 illustrated in FIG. 4. In this embodiment, the electric charge is rapidly discharged by the switching unit. Since the cooling jacket 12 is provided between the resistor 450 and the driver circuit board 22 controlling discharge, the driver circuit board 22 can be protected from the resistor 450. Further, since the resistor 450 is fixed to the lower cover 420 and is located at a thermal position very close to the flow passage 19, the abnormal heating of the resistor 450 can be suppressed.

Figure 6:
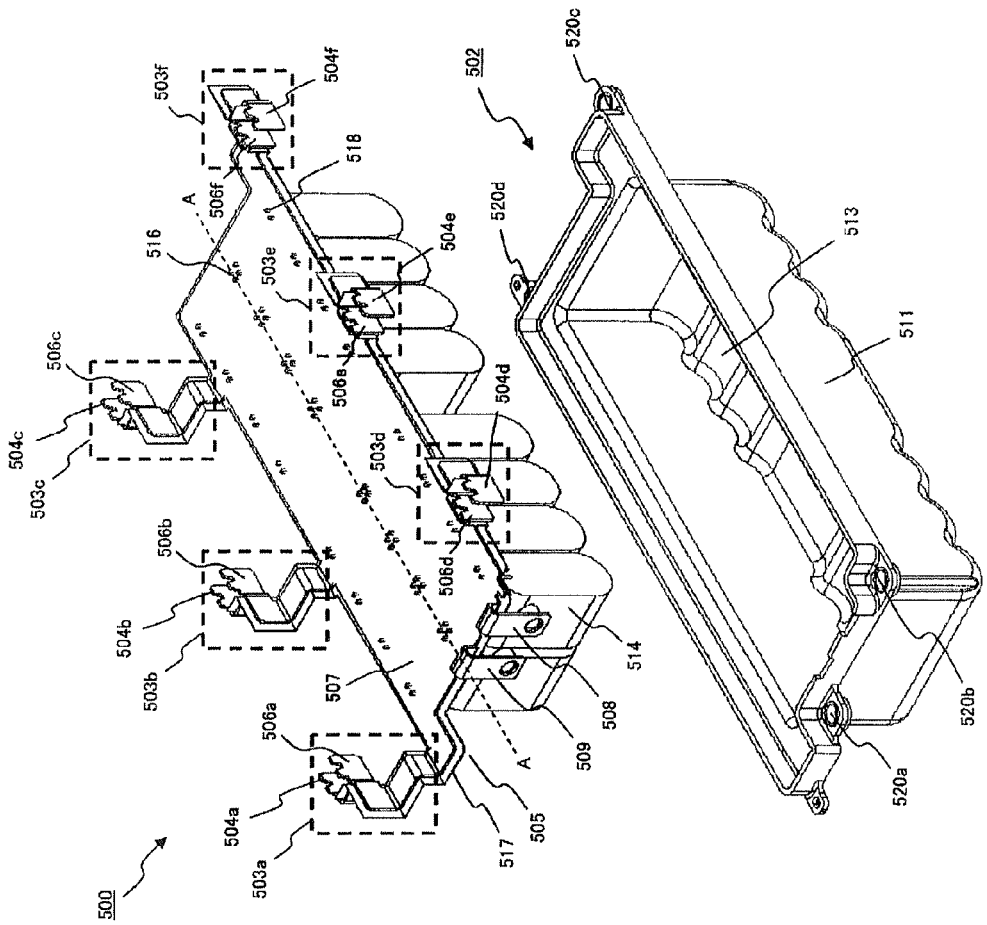
FIG. 6 is an exploded perspective view of a capacitor module 500.

FIG. 6 is an exploded perspective view of the capacitor module 500. A stacked conductor plate 501 includes a negative conductor plate 505 and a positive conductor plate 507 formed of a laminated wide conductor, and an insulating sheet 517 inserted between the negative conductor plate 505 and the positive conductor plate 507, thus achieving a low inductance. The stacked conductor plate 501 has a generally rectangular shape. A battery negative side terminal 508 and a battery negative side terminal 509 are formed to stand from one side of the stacked conductor plate 501 in the lateral direction.

Capacitor terminals 503a to 503c are formed to stand from one side of the stacked conductor plate 501 in the longitudinal direction. Capacitor terminals 503d to 503f are formed to stand from the other side of the stacked conductor plate 501 in the longitudinal direction. Further, the capacitor terminals 503a to 503f stand across the principal surface of the stacked conductor plate 501. The capacitor terminals 503a to 503c are connected respectively to the power modules 300a to 300c. The capacitor terminals 503d to 503f are connected respectively to the power modules 301a to 301c. A portion of the insulating sheet 517 is provided between a negative side capacitor terminal 504a and a positive side capacitor terminal 506a constituting the capacitor terminal 503a, thus securing insulation. This is the same for the other capacitor terminals 503b to 503f. Further, in this embodiment, the negative conductor plate 505, the positive conductor plate 507, the battery negative side terminal 508, the battery negative side terminal 509, and the capacitor terminals 503a to 503f include a metal plate that is integrally formed, thus achieving inductance reduction and productivity improvement.

A plurality of capacitor cells 514 is provided under the stacked conductor plate 501. In this embodiment, eight capacitor cells 514 are aligned along one side of the stacked conductor plate 501 in the longitudinal direction, and other eight capacitor cells 514 are aligned along the other side of the stacked conductor plate 501 in the longitudinal direction, so that a total of 16 capacitor cells are provided. The capacitor cells 514 arranged along the respective sides of the stacked conductor plate 501 in the longitudinal direction are arranged symmetrically with respect to the boundary of a broken line portion AA illustrated in FIG. 6. Accordingly, when the DC current smoothed by the capacitor cells 514 is supplied to the power modules 300a to 300c and the power modules 301a to 301c, the current balance between the capacitor terminals 503a to 503c and the capacitor terminals 503d to 503f is uniformed and the reduction of the inductance of the stacked conductor plate 501 can be achieved. Further, since a local current flow in the stacked conductor plate 501 can be prevented, the heat balance can be uniformed and the heat resistance can be improved.

Further, the battery negative side terminal 508 and the battery negative side terminal 509 are arranged symmetrically with respect to the boundary of a dotted line AA illustrated in FIG. 6. Likewise, since the current balance between the capacitor terminals 503a to 503c and the capacitor terminals 503d to 503f is uniformed, the reduction of the inductance of the stacked conductor plate 501 can be achieved. Further, since the heat balance is uniformed, the heat resistance can be improved.

The capacitor cell 514 of this embodiment is a unitary structure of a capacitor portion of the capacitor module 500, and uses a film capacitor having two metal sheets as a positive electrode and a negative electrode by stacking and winding two films deposited with metal such as Al on one side. The electrode of the capacitor cell 514 has wound axial surfaces as a positive electrode and a negative electrode, and is manufactured by blowing a conductor such as Sn. A cell terminal 516 and a cell terminal 518 are connected to the positive electrode and the negative electrode, are extended across an opening portion of the stacked conductor plate 501 to the opposite side to the disposition side of the capacitor cell 514, and are connected to the positive conductor plate 507 and the negative conductor plate 505 by soldering or welding.

A capacitor case 502 includes a receiving portion 511 for receiving the capacitor cell 514, and the top surface and the bottom surface of the receiving portion 511 have a generally rectangular shape. A flange portion 515a is provided at one side of the receiving portion 511 in the longitudinal direction, and a flange portion 515b is provided at the other side. The flange portion 515a is provided with through-holes 519a to 519c for passing the respective terminals that extend from an insertion slot 306 of a module case 304. Likewise, the flange portion 515b is provided with through-holes 519d to 519f. Further, the respective side portions of the through-holes 519a to 519f are provided with holes 520a to 520h for passing a fixing unit that fixes the capacitor module 500 to the cooling jacket 12. By providing the hole 520b, the hole 520c, the hole 520f, and the hole 520g between the power module and the flow passage 19, the airtightness between the power module and the flow passage 19 is improved. The flange portion 515a and the flange portion 515b have a honeycomb structure in order to improve the lightweight of the capacitor case 502 and the fixing strength to the cooling jacket 12.

A bottom portion 513 of the receiving portion 511 has a smooth concavo-convex shape or a waveform shape in order to fit the surface shape of the cylindrical capacitor cell 514. Accordingly, the module connected with the stacked conductor plate 510 and the capacitor cell 514 is easily located at the capacitor case 502. Further, after the stacked conductor plate 501 and the capacitor cell 514 are received in the capacitor case 502, a filler (not illustrated) is filled into the capacitor case 502 to cover the stacked conductor plate 501 except the capacitor terminals 503a to 503f, the battery negative side terminal 508 and the battery negative side terminal 509. Since the bottom portion 513 has the waveform shape to fit the shape of the capacitor cell 514, the shift of the capacitor cell 514 from a predetermined position can be prevented when the filler is filled into the capacitor case 502.

Further, by the ripple current at the time of switching, the capacitor cell 514 is heated by the electrical resistance of an internal conductor and a metal thin film deposited on an internal film. Therefore, in order to facilitate the dissipation of the heat of the capacitor cell 514 to the capacitor case 502, the capacitor cell 514 is molded by a filler. In addition, by using a resin filler, the moisture resistance of the capacitor cell 514 can be improved.

In addition, in this embodiment, since the sidewall forming the longitudinal side of the receiving portion 511 is inserted into the flow passage 19, the capacitor module 500 can be cooled efficiently. Further, one of the electrode surfaces of the capacitor cell 514 is formed to face the inner wall forming the longitudinal side of the receiving portion 511. Accordingly, since heat is easily transferred in the direction of a winding axis of the film, the heat is easily dissipated to the capacitor case 502 through the electrode surface of the capacitor cell 514.

FIG. 7(a) is an external appearance perspective view in which the power module, the capacitor module, and the bus bar module are assembled to the cooling jacket 12. FIG. 7(b) is an enlarged view of a portion surrounded by a broken line of FIG. 7(a).

Figure 7:
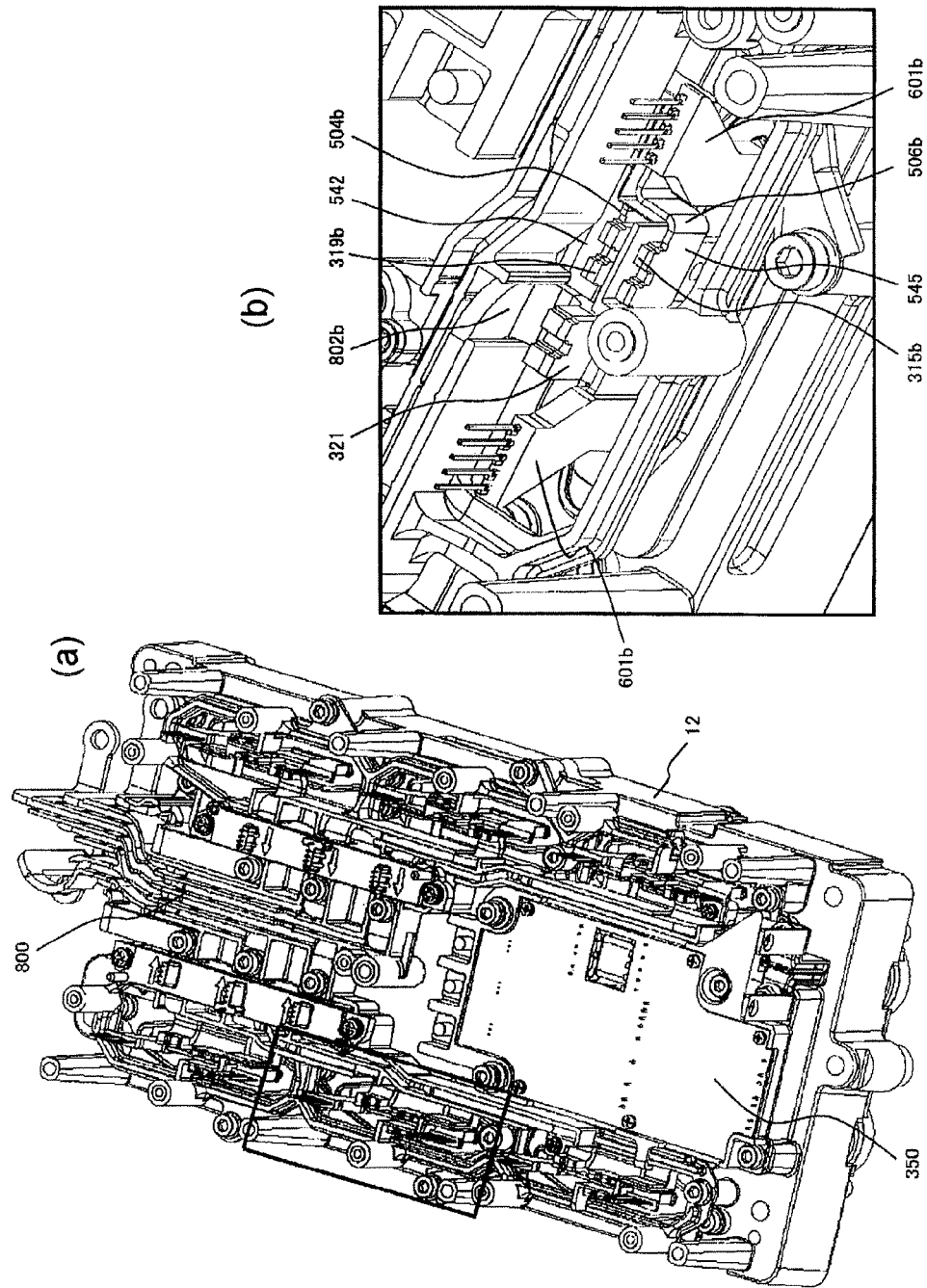
FIG. 7 is a view illustrating an external appearance in which a power module, the capacitor module, and a bus bar module are assembled to the cooling jacket 12.

As illustrated in FIG. 7 (b), a DC negative terminal 315b, a DC positive terminal 319b, an AC terminal 321, and a second sealing portion 601b extend through the through-hole 519 of the capacitor case 502 to the top side of the flange portion 515a. The area of the current path of the DC negative terminal 315b and the DC positive terminal 319b is much smaller than the area of the current path of the stacked conductor plate 501. Therefore, when a current flows from the stacked conductor plate 510 to the DC negative terminal 315b and the DC positive terminal 319b, the area of the current path changes greatly. That is, the current is concentrated on the DC negative terminal 315b and the DC positive terminal 319b. Further, when the DC negative terminal 315b and the DC positive terminal 319b protrude across the stacked conductor plate 501, that is, when the DC negative terminal 315b and the DC positive terminal 319b have the relationship of a skew position with respect to the stacked conductor plate 501, a new connection conductor is required, thus causing productivity reduction and cost increase.

Therefore, in this embodiment, the negative side capacitor terminal 504a includes a standing portion 540 that stands from the stacked conductor plate 501, a folded portion 541 that is connected to the standing portion 540 and is bent in a U shape, and a connection portion 542 that is connected to the folded portion 541 and has a surface that is opposite to the standing portion 540 faces the principal surface of the DC negative terminal 315b. Further, the positive side capacitor terminal 506a includes a standing portion 543 that stands from the stacked conductor plate 501, a folded portion 544, and a connection portion 545 that is connected to the folded portion 544 and has a surface that is opposite to the standing portion 543 faces the principal surface of the DC positive terminal 319b. In particular, the folded portion 544 is connected to be generally perpendicular to the standing portion 543, and is bridged across the side portions of the negative side capacitor terminal 504a, the DC negative terminal 315b and the DC positive terminal 319b. That is, the principal surface of the standing portion 540 and the principal surface of the standing portion 543 face each other through the insulating sheet 517. Likewise, the principal surface of the folded portion 541 and the principal surface of the folded portion 544 face each other through the insulating sheet 517.

Accordingly, since the capacitor terminal 503a forms a stack structure through the insulating sheet 517 immediately before the connection portion 542, the interconnection inductance of the capacitor terminal 503a on which a current is concentrated can be reduced. Further, the folded portion 544 is bridged across the side portions of the negative side capacitor terminal 504a, the DC negative terminal 315b and the DC positive terminal 319b. In addition, the front end of the DC positive terminal 319b and the sidewall of the connection portion 542 are connected by welding. Likewise, the front end of the DC negative terminal 315b and the sidewall of the connection portion 545 are connected by welding.

Accordingly, since the folded portion 544 does not interfere with the direction of work for connecting the DC positive terminal 319b and the DC negative terminal 315b by welding, the low inductance can be achieved and the productivity can be improved.

Further, the front end of the AC terminal 321 is connected to the front end of an AC bus bar 802a by welding. In a manufacturing equipment for welding, making a welding machine movable to a welding target in a plurality of directions is not preferable from the viewpoint of productivity and cost because it complicates the manufacturing equipment. Therefore, in this embodiment, the welding point of the AC terminal 321 and the welding point of the DC positive terminal 319 are aligned along the longitudinal side of the cooling jacket 12. Accordingly, a plurality of welding operations can be performed while moving the welding machine in one direction, and the productivity is improved.

In addition, as illustrated in FIGS. 4 and 7(*a*), a plurality of power modules 300*a* to 300*c* is aligned along the longitudinal side of the cooling jacket 12. Accordingly, when the plurality of power modules 300*a* to 300*c* is welded, the productivity can be further improved.

Figure 8:
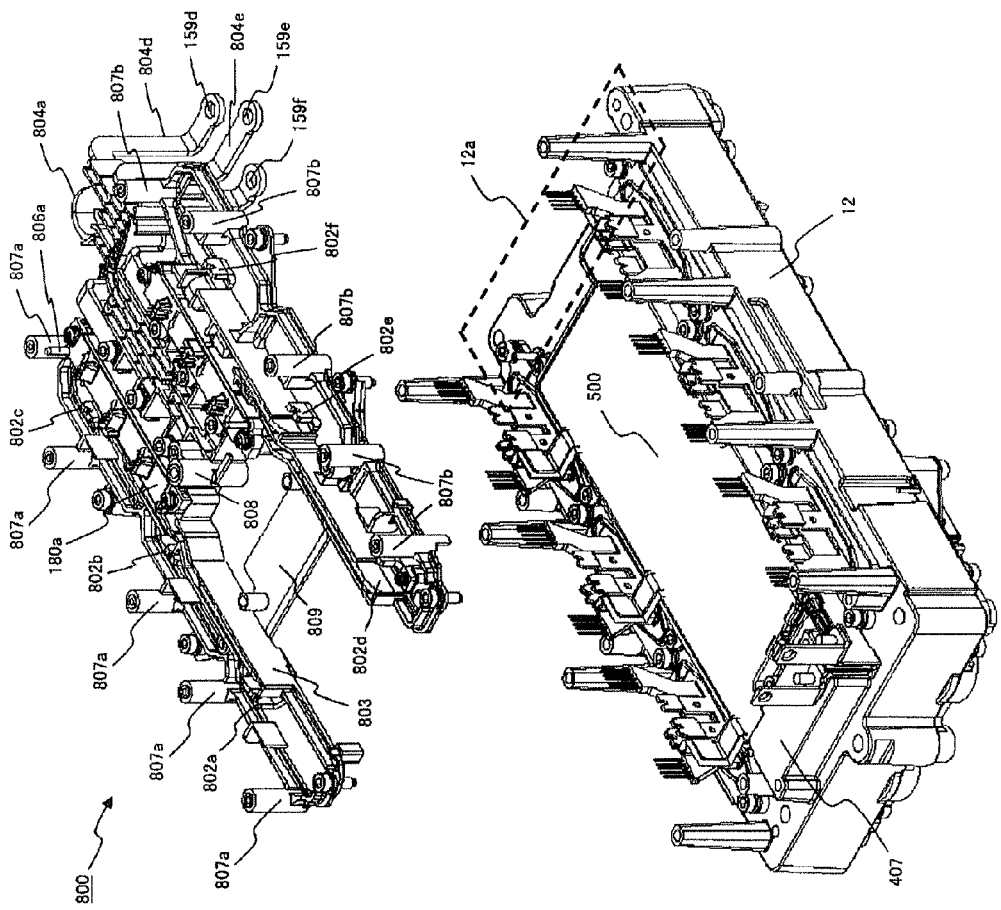
FIG. 8 is an exploded perspective view of the cooling jacket 12 and the bus bar module 800.
Figure 9:
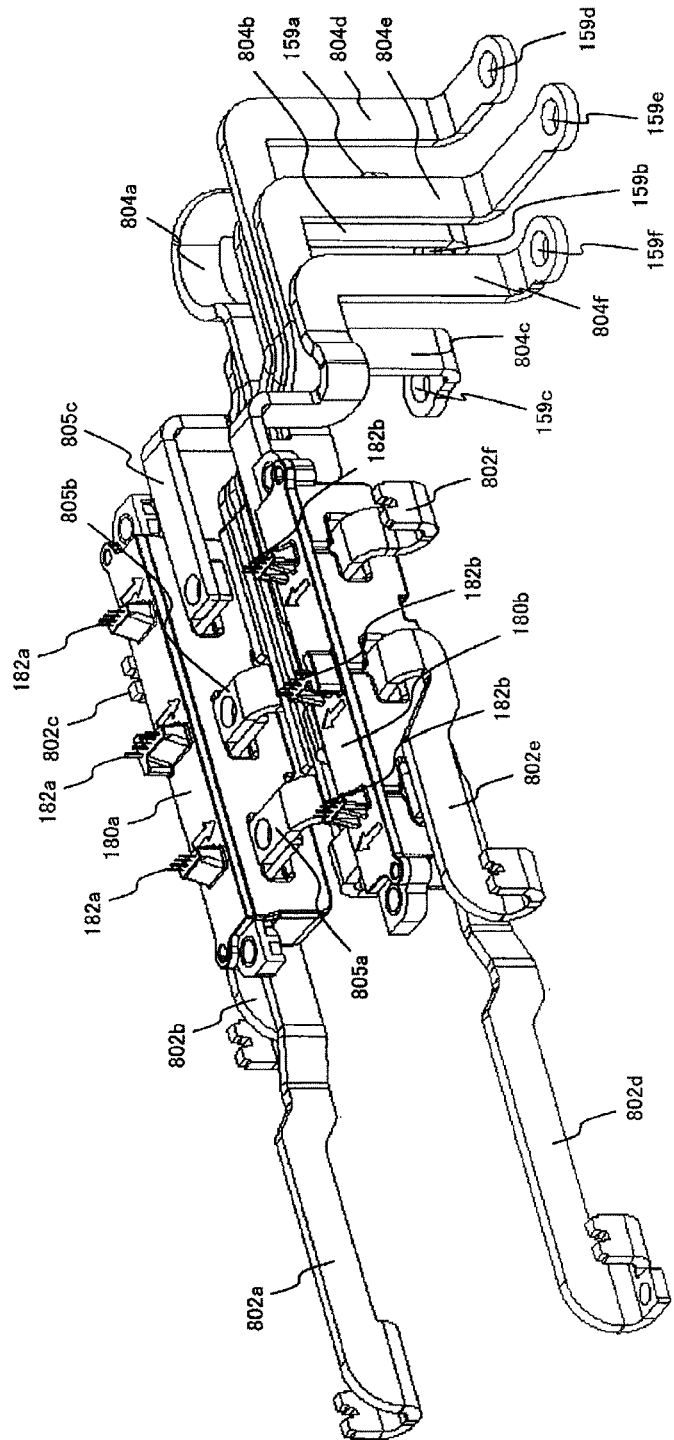
FIG. 9 is an external appearance perspective view of the bus bar module 800 excluding a holding member 803.

FIG. 8 is an exploded perspective view of the cooling jacket 12 and the bus bar module 800 in which the power module and the capacitor module are assembled. FIG. 9 is an external appearance perspective view of the bus bar module 800 excluding a holding member 803.

As illustrated in FIGS. 8 and 9, first AC bus bars 802*a* to 802*f* are formed to the installation point of a current sensor 180*a* or a current sensor 180*b* such that the principal surfaces of the first AC bus bars 802*a* to 802 are generally perpendicular to the principal surface of the stacked conductor plate 501 of the capacitor module 500. Further, the first AC bus bars 802*a* to 802*f* are bent generally perpendicularly immediately before the through-hole of the current sensor 180*a* or the through-hole of the current sensor 180*b*. Accordingly, the principal surface of a portion of the first AC bus bars 802*a* to 802*f* passing through the current sensor 180*a* or the current sensor 180*b* is generally parallel to the principal surface of the stacked conductor plate 501. Connection portions 805*a* to 805*f* (connection portions 805*d* to 805*f* are not illustrated) for connection with second AC bus bars 804*a* to 804*f* are formed at the end portions of the first AC bus bars 802*a* to 802*f*.

The second AC bus bars 804*a* to 804*f* are bent generally perpendicularly toward the capacitor module 500 in the vicinity of the connection portions 805*a* to 805*f*. Accordingly, the principal surfaces of the second AC bus bars 804*a* to 804*f* are formed to be generally perpendicular to the principal surface of the stacked conductor plate 501 of the capacitor module 500. In addition, the second AC bus bars 804*a* to 804*f* are formed to extend from the vicinity of the current sensor 180*a* or the current sensor 180*b* toward one lateral side 12*a* of the cooling jacket 12 illustrated in FIG. 9 and to cross the lateral side 12*a*. That is, the second AC bus bars 804*a* to 804*f* are formed across the lateral side 12*a* while the principal surfaces of the plurality of second AC bus bars 804*a* to 804*f* is facing each other.

Accordingly, without increasing the total device size, a plurality of plate-shaped AC bus bars can be protruded from the short side of the cooling jacket 12. Further, by protruding the plurality of AC bus bars from one side of the cooling jacket 12, interconnection processing outside the power converter 200 is facilitated, thus improving the productivity.

As illustrated in FIG. 8, the first AC bus bars 802*a* to 802*f*, the current sensors 180*a* and 180*b*, and the second AC bus bars 804*a* to 804*f* are held and insulated by a holding member 803 formed of resin. By the holding member 803, the second AC bus bars 804*a* to 804*f* improve the insulation between the housing 119 and the cooling jacket 12 formed of metal. Further, since the holding member 803 thermally or directly contact the cooling jacket 12, the heat transferred from the transmission 118 to the second AC bus bars 804*a* to 804*f* can be dissipated to the cooling jacket 12. Therefore, the reliability of the current sensors 180*a* and 180*b* can be improved.

Figure 2:
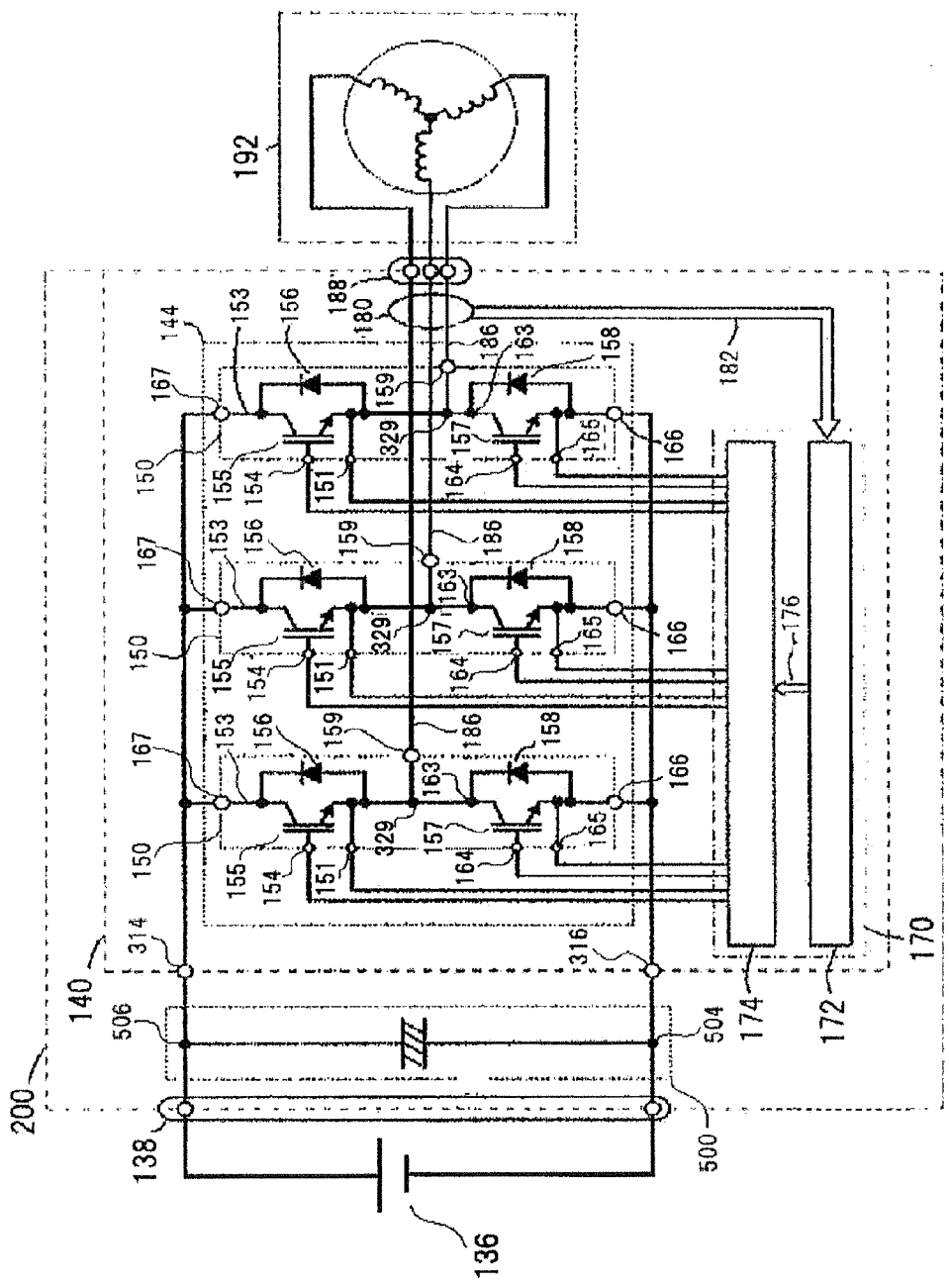
FIG. 2 is a circuit diagram of a power converter 200.

As illustrated in FIG. 8, the holding member 803 is provided with a support member 807*a* and a support member 807*b* for supporting the driver circuit board 22 illustrated in FIG. 2. A plurality of support members 807*a* is aligned along one longitudinal side of the cooling jacket 12. A plurality of support members 807*b* is aligned along the other longitudinal side of the cooling jacket 12. A screw hole for fixing the driver circuit board 22 is formed at the end portions of the support member 807*a* and the support member 807*b*.

In addition, the holding member 803 is provided with a protrusion portion 806*a* and a protrusion portion 806*b* that extend upward from the installation points of the current sensor 180*a* and the current sensor 180*b*. The protrusion portion 806*a* and the protrusion portion 806*b* are configured to pass through the current sensor 180*a* and the current sensor 180*b* respectively. As illustrated in FIG. 9, the current sensor 180*a* and the current sensor 180*b* are provided with a signal line 182*a* and a signal line 182*b* that extend in the disposition direction of the driver circuit board 22. The signal line 182*a* and the signal line 182*b* are joined to the interconnection pattern of the driver circuit board 22 by soldering. In this embodiment, the holding member 803, the support members 807*a* and 807*b*, and the protrusion portions 806*a* and 806*b* are integrally formed of resin.

Accordingly, since the holding member 803 has a function of locating the current sensor 180 and the driver circuit board 22, the assembly and the soldering connection between the signal line 182*a* and the driver circuit board 22 are facilitated. Further, since the holding member 803 is provided with a mechanism holding the current sensor 180 and the driver circuit board 22, the total number of components of the power converter can be reduced.

In this embodiment, since the power converter 200 is fixed to the housing 119 receiving the transmission 118, the power converter 200 is greatly affected by the vibration from the transmission 118. Therefore, the holding member 803 is provided with a support member 808 for supporting the vicinity of a center portion of the driver circuit board 22, thus reducing the influence of the vibration applied to the driver circuit board 22. Further, the holding member 803 is fixed to the cooling jacket 12 by screws.

Further, the holding member 803 is provided with a bracket 809 for fixing one end portion of the auxiliary power module 350. Further, as illustrated in FIG. 4, since the auxiliary power module 350 is disposed at the protrusion portion 407, the other end portion of the auxiliary power module 350 is fixed to the protrusion portion 407. Accordingly, the influence of the vibration applied to the auxiliary power module 350 can be reduced, and the number of fixing components can be reduced.

Figure 10:
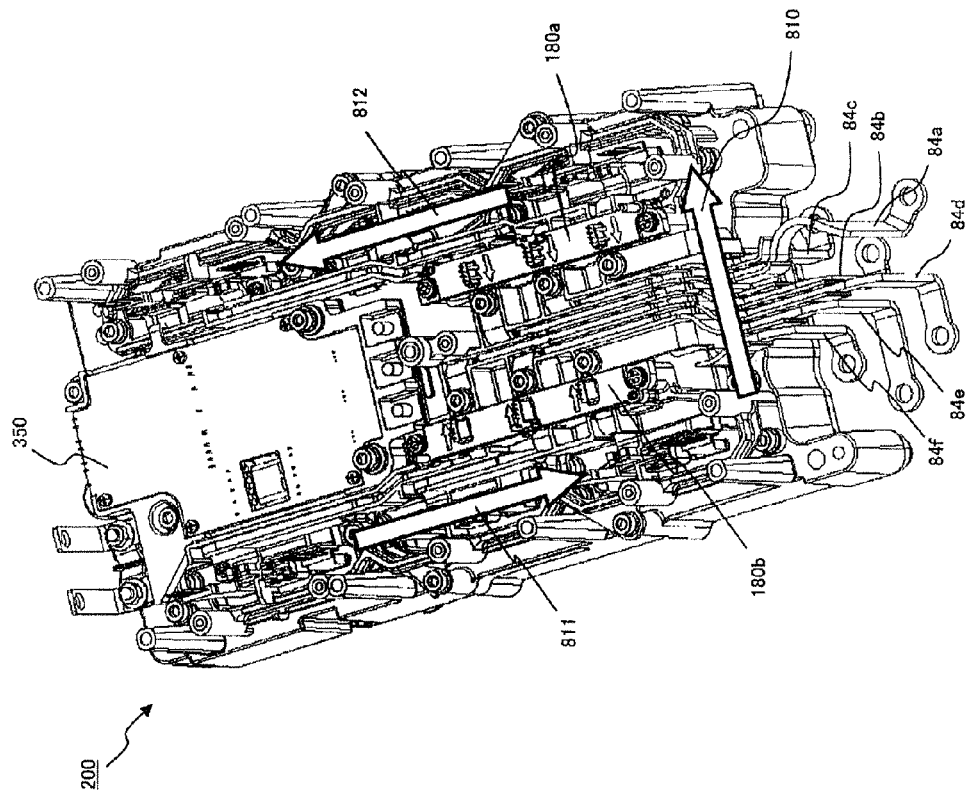
FIG. 10 is an external appearance perspective view of the cooling jacket 12 in which the power module, the capacitor module, the bus bar module 800, and an auxiliary power module 350 are assembled.

FIG. 10 is an external appearance perspective view of the cooling jacket 12 in which the power module, the capacitor module, the bus bar module 800, and the auxiliary power module 350 are assembled. The current sensor 180 may be destroyed when heated above a heat resistance temperature of about 100° C. In particular, since the use environment of an in-car power converter is heated to a very high temperature, it is important to protect the current sensor 180 from heat. In particular, since the power converter 200 of this embodiment is mounted on the transmission 118, it is important to protect the power converter 200 against the heat generated from the transmission 118.

Therefore, in this embodiment, the current sensor 180*a* and the current sensor 180*b* are disposed across the cooling jacket 12 at the opposite side to the transmission 118. Accordingly, since the heat generated by the transmission 118 is hardly transferred to the current sensor, the temperature rise of the current sensor can be suppressed. In addition, the second AC bus bars 804*a* to 804*f* are formed across the flow direction 810 of a refrigerant flowing through the third flow passage portion 19c illustrated in FIG. 5. The current sensor 180a and the current sensor 180b are disposed closer to the AC terminal 321 of the power module than the portion of the second AC bus bars 804a to 804f across the third flow passage portion 19c. Accordingly, the second AC bus bars 804a to 804f are cooled indirectly by the refrigerant. In addition, since the heat transferred from the AC bus bar to the current sensor and a semiconductor chip included in the power module can be reduced, the reliability is improved.

A flow direction 811 illustrated in FIG. 10 represents the flow direction of a refrigerant flowing through the fourth flow passage portion 19d illustrated in FIG. 5. Likewise, a flow direction 812 represents the flow direction of a refrigerant flowing through the second flow passage portion 19b illustrated in FIG. 5. When the current sensor 180a and the current sensor 180b according to this embodiment are projected from above the power converter 200, a projection portion of the current sensor 180a and the current sensor 180b is disposed to be surrounded by a projection portion of the flow passage 19. Accordingly, the current sensor can be further protected from the heat of the transmission 118.

Figure 11:
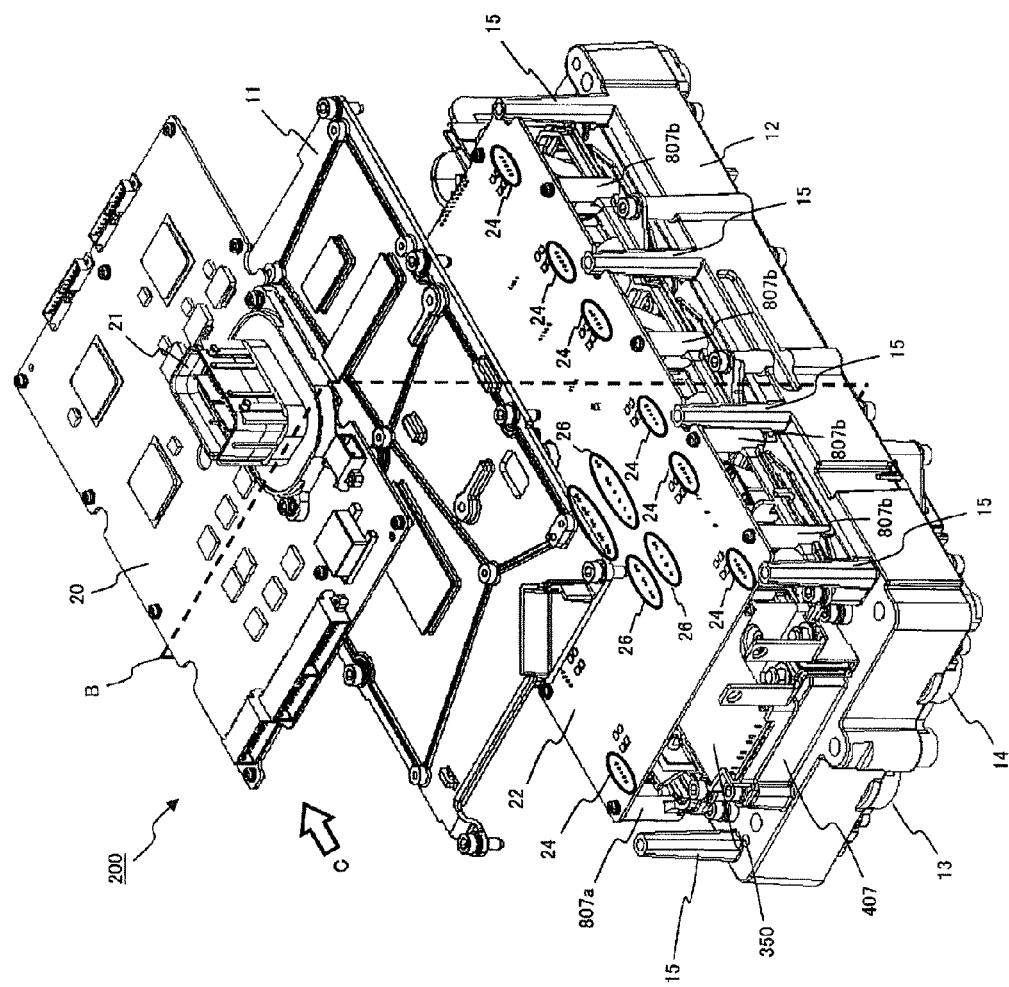
FIG. 11 is a disassembled perspective view of the power converter 200 in which a control circuit board 20 and a metal base plate 11 are disassembled.

FIG. 11 is a disassembled perspective view of the power converter 200 in which the control circuit board 20 and the metal base plate 11 are disassembled. As illustrated in FIG. 10, the current sensor 180 is disposed above the capacitor module 500. The driver circuit board 22 is disposed above the current sensor 180, and is supported by the support members 807a and 807b provided in the bus bar module 800 illustrated in FIG. 8. The metal base plate 11 is disposed above the driver circuit board 22, and is supported by a plurality of support members 15 that stand from the cooling jacket 12. The control circuit board 20 is disposed above the metal base plate 11, and is fixed to the metal base plate 11.

The current sensor 180, the driver circuit board 22, and the control circuit board 20 are aligned hierarchically in the height direction, and the control circuit board 20 is disposed farthest from the power modules 300 and 301 of a strong electric system. Therefore, the mixing of a switching noise or the like can be suppressed. In addition, the metal base plate 11 is electrically connected to the cooling jacket 12 that is electrically connected to the ground. A noise mixed from the driver circuit board 22 into the control circuit board 20 is reduced by the metal base plate 11.

In this embodiment, since a cooling target of a refrigerant flowing through the flow passage 19 is mainly the power modules 300 and 301 for driving, the power modules 300 and 301 are received in the flow passage 19 and are cooled by directly contacting the refrigerant. On the other hand, it is required to cool the auxiliary power module 350, but not as much as the driving power modules.

Therefore, in this embodiment, a heat dissipation surface formed of a metal base of the auxiliary power module 350 is formed to face the inlet pipe 13 and the outlet pipe 14 through the flow passage 19. In particular, since the protrusion portion 407 fixing the auxiliary power module 350 is formed above the inlet pipe 13, the refrigerant flowing in from the bottom side collides with the inner wall of the protrusion portion 407 and efficiently absorbs the heat from the auxiliary power module 350. In addition, a space connected to the flow passage 19 is formed in the protrusion portion 407. The depth of the flow passage 19 in the vicinity of the inlet pipe 13 and the outlet pipe 14 is increased by the space in the protrusion portion 407, and a liquid pool is generated at the space in the protrusion portion 407. The auxiliary power module 350 can be efficiently cooled by the liquid pool.

When the current sensor 180 and the driver circuit board 22 are electrically connected by an interconnection connector, the risk of a connection error and a connection process increase may be caused.

Therefore, as illustrated in FIG. 11, a first hole 24 and a second hole 26 passing through the driver circuit board 22 are formed in the driver circuit board 22 of this embodiment. Further, a signal terminal 325U and a signal terminal 325L of the power module 300 are inserted into the first hole 24, and the signal terminal 325U and the signal terminal 325L are joined to the interconnection pattern of the driver circuit board 22 by soldering. In addition, a signal line 182 of the current sensor 180 is inserted into the second hole 26, and the signal line 182 is joined to the interconnection pattern of the driver circuit board 22 by soldering. Further, a soldering joint is performed from the surface of the driver circuit board 22 opposite to the facing surface with respect to the cooling jacket 12.

Accordingly, since the signal line can be connected without using an interconnection connector, the productivity can be improved. Further, since the signal terminal 325 of the power module 300 and the signal line 182 of the current sensor 180 are joined by soldering from the same direction, the productivity can be further improved. Further, by providing the driver circuit board 22 with the first hole 24 for passing the signal terminal 325 and the second hole 26 for passing the signal line 182, the risk of a connection error can be reduced.

Further, a drive circuit (not illustrated) such as a driver IC chip is mounted on the surface of the driver circuit board 22 that faces the cooling jacket 12. Accordingly, the transfer of soldering joint heat to the driver IC chip and the like is suppressed, and the damage of the driver IC chip and the like by the soldering joint is prevented. Further, since a high component such as a transformer mounted on the driver circuit board 22 is disposed in the space between the capacitor module 500 and the driver circuit board 22, the total height of the power converter 200 can be reduced.

Figure 12:
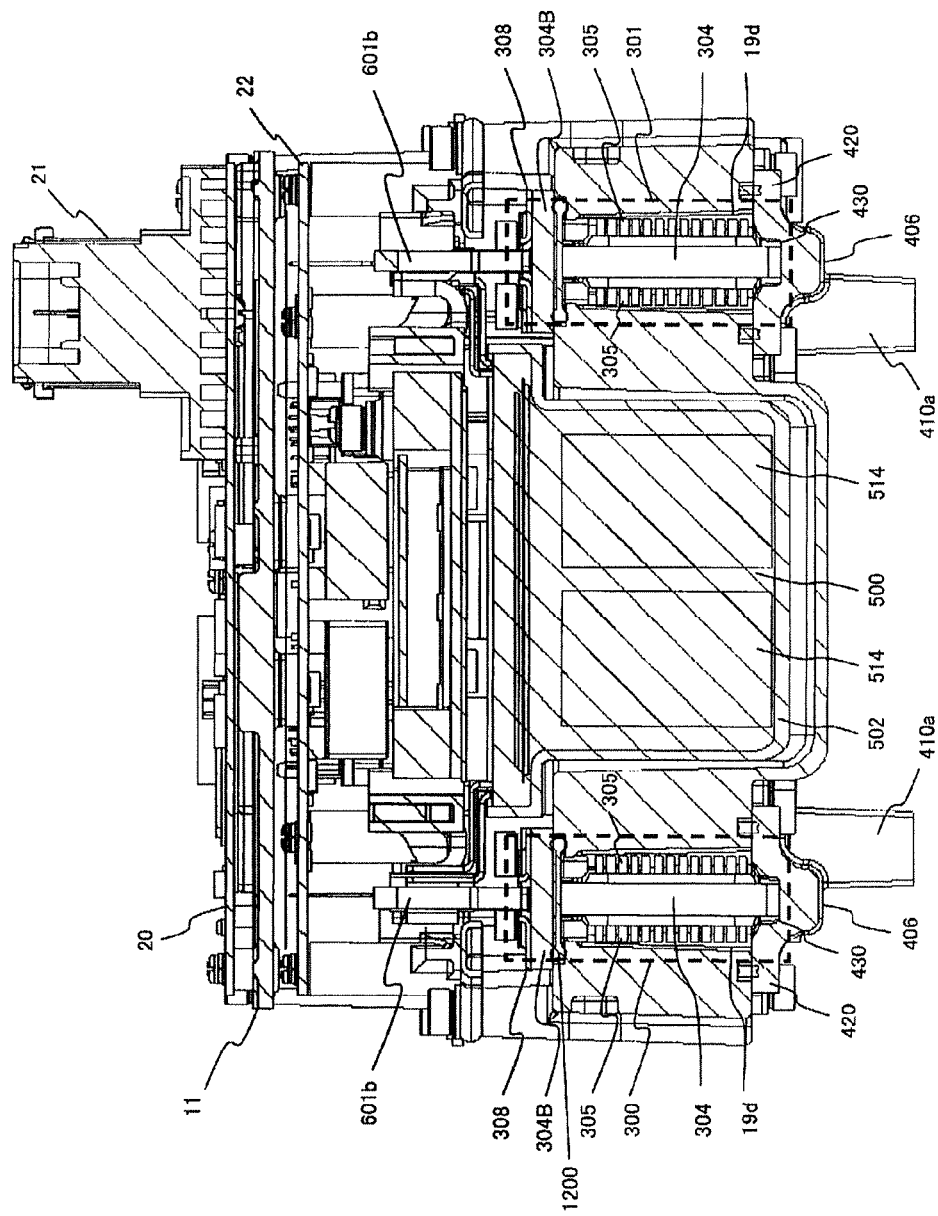
FIG. 12 is a cross-sectional view of the power converter 200 viewed in a direction C.

FIG. 12 is a cross-sectional view of the power converter 200 viewed in a direction C and taken along a side B of FIG. 11. A flange 304B provided in the module case 304 is pressed against the cooling jacket 12 by a flange 515a or a flange 515b provided in the capacitor case 502. That is, by pressing the module case 304 against the cooling jacket 12 by the own weight of the capacitor case 502 receiving the capacitor cell 514, the airtightness of the flow passage 19 can be improved.

In order to improve the cooling efficiency of the power module 300, it is necessary to flow the refrigerant inside the flow passage 19 into a region in which a fin 305 is formed. In order to secure the space for thin portions 304A and 304A', the fin 305 is not formed at a bottom portion of the module case 304. Therefore, the lower cover 420 is formed such that the bottom portion of the module case 304 is fitted to a concave portion 430 formed at the lower cover 420. Accordingly, a refrigerant can be prevented from flowing into the space in which a cooling fin is not formed.

As illustrated in FIG. 12, the arrangement direction of the power module 300, the capacitor module 500 and the power module 301 are disposed side by side across the arrangement direction of the control circuit board 20, the driver circuit board 22 and the transmission 118. In particular, the power module 300, the capacitor module 500 and the power module 301 are disposed side by side on the lowermost layer in the power converter 200. Accordingly, the total height of the power converter 200 can be reduced, and the influence of the vibration from the transmission 118 can be reduced.

[Structure of Power Module]

Figure 13:
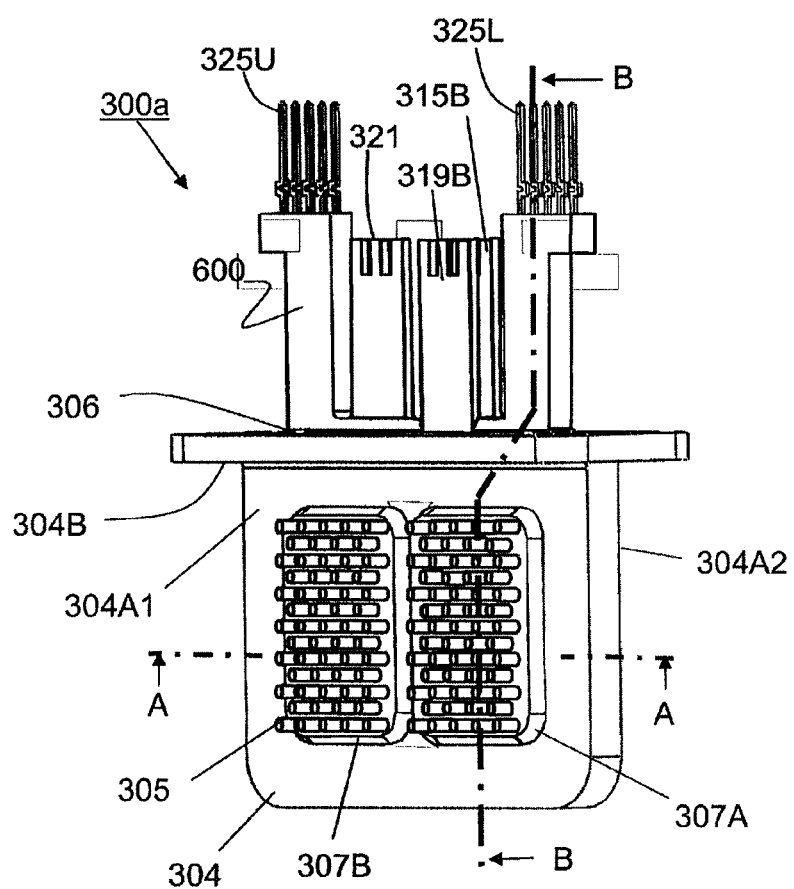
Figure 14:
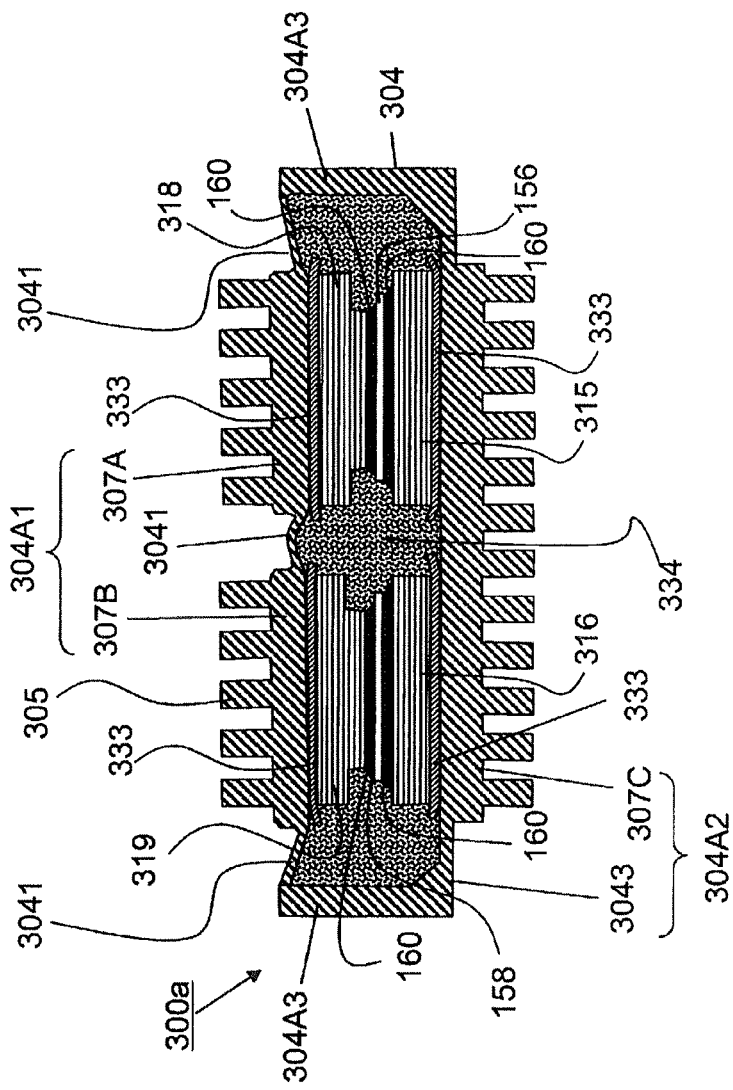
FIG. 14 is an A-A cross-sectional view of FIG. 13.
Figure 15:
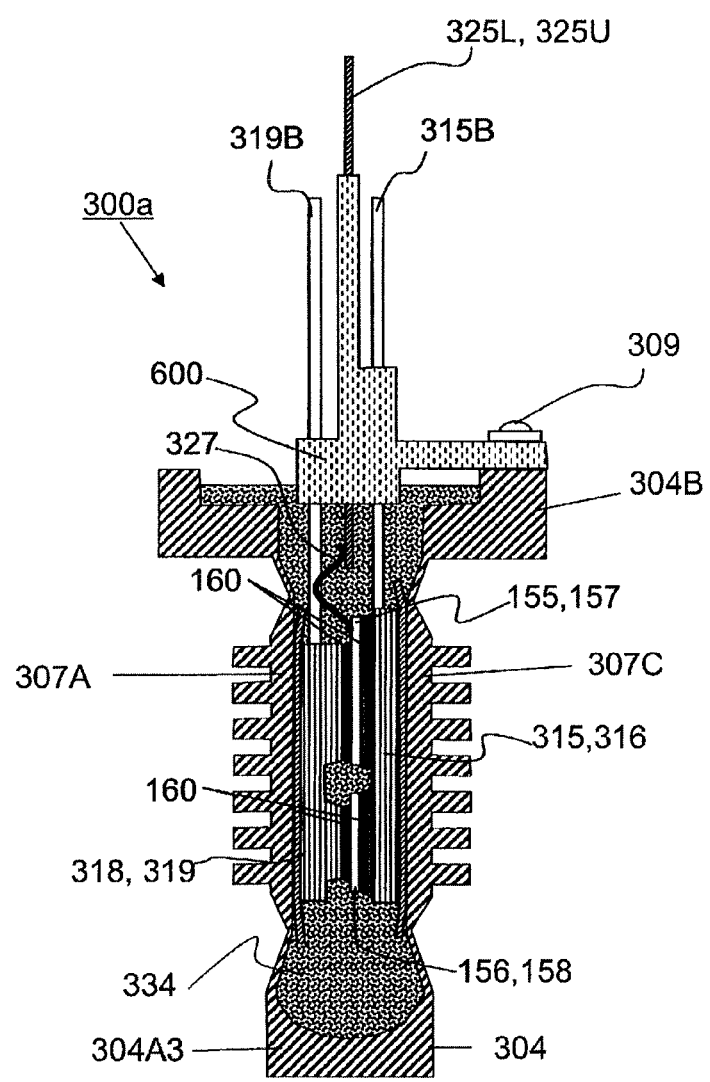
FIG. 15 is a B-B cross-sectional view of FIG. 13.

FIG. 13 is a perspective view illustrating an external appearance of the power module 300a illustrated in FIG. 4. FIG. 14 is an A-A cross-sectional view of FIG. 13. FIG. 15 is a B-B cross-sectional view of FIG. 13. Although the power module 300a is hereinafter described as an example, the other power modules 300b, 300c and 301a to 301c have the same structure as the power module 300a. In the power module 300a, a semiconductor device unit including one pair of upper/lower arm series circuits 150 illustrated in FIG. 16 is received in the module case 304 that functions as a heat dissipater.

Figure 16:
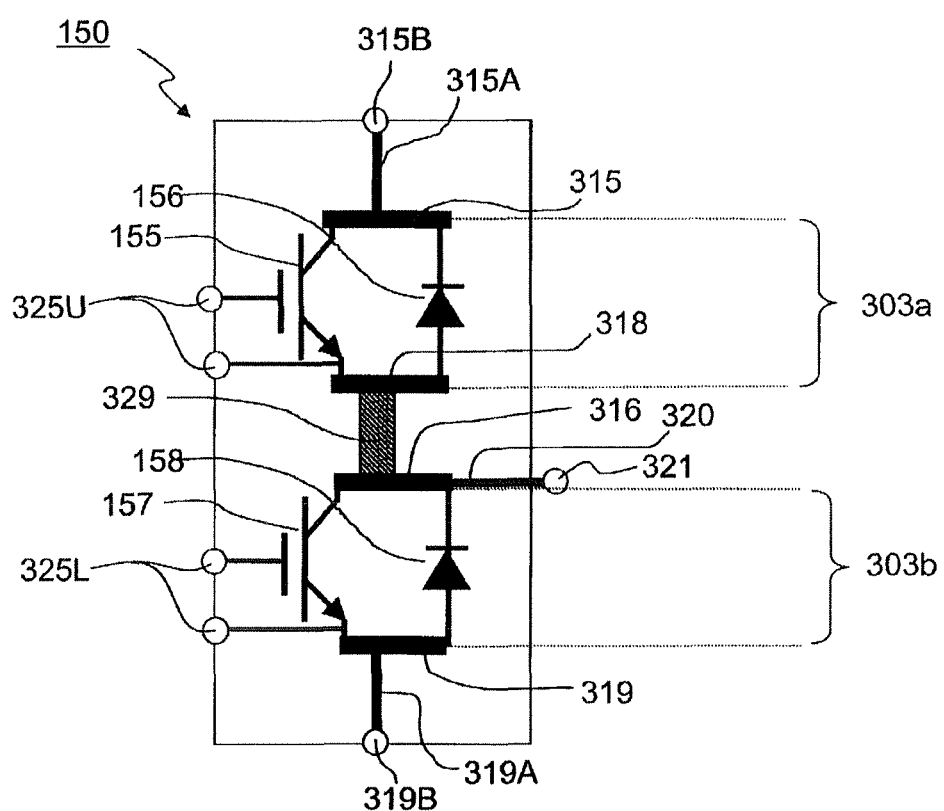
FIG. 16 is a diagram illustrating an upper/lower arm series circuit 150.

The upper/lower arm series circuit 150 illustrated in FIG. 16 is one of three pairs of upper/lower arm series circuits 150 illustrated in the circuit diagram of the power converter 200 illustrated in FIG. 2. FIG. 2 mainly illustrates circuit elements, but FIG. 15 illustrates members (for example, a lead frame and the like) constituting the power module 300a in addition to the circuit elements.

As illustrated in FIG. 13, in the power module 300a, terminals (DC positive terminal 3153, DC negative terminal 3193, signal terminal 325U, and signal terminal 325L) are disposed to protrude upward from the opening portion of the module case 304 in which the semiconductor device unit is received. The signal terminal 325U and the signal terminal 325L are integrally formed by an auxiliary mold body 600 formed of a resin material.

The module case 304 is formed of a composite material such as Cu, Cu alloy, Cu—C and Cu—CuO, or a composite material such as Al, Al alloy, AlSiC and Al—C. The module case 304 is integrally formed in the shape of a case without a joint by high-waterproof joining such as welding, forging, or casting. The module case 304 has a flat can structure that is not provided with openings other than an insertion slot 306 for inserting the semiconductor device unit. A flange 3043 surrounding an opening is formed at the insertion slot 306.

As illustrated in FIG. 14, the module case 304 of a flat shape includes a frame portion 304A3 and a pair of wall portions 304A1 and 304A2 that is disposed to face each other while nipping the frame portion 304A3. In the wall portion 304A1, two separate thick heat dissipation portions 307A and 307B, and a support wall 3041 surrounding the thick heat dissipation portions 307A and 307B and supporting the thick heat dissipation portions 307A and 307B at the frame portion 304A3 are formed. As will be described later, since the support wall 3041 is deformed, the support wall 3041 has a thin structure so that the support wall 3041 can be easily deformed. FIG. 14 illustrates a state after deformation, and the support wall 3041 is deformed to be recessed inside the case from the frame portion 304A3 to the thick heat dissipation portions 307A and 307B.

On the other hand, as illustrated in FIG. 14, in the wall portion 304A2 of the opposite side, one large thick heat dissipation portion 307C is supported at the frame portion 304A3 by a support wall 3043. A plurality of fins 305 is uniformly formed on the outer periphery of the thick heat dissipation portions 307A, 307B and 307C. The module case 304 may not have an exact rectangular shape, and the angle may be curved.

As illustrated in FIG. 12, a gap between the flange 304B and the cooling jacket 12 in which a flow passage is formed is sealed by a seal 1200. By using the metal case with such a shape, even when the module case 304 is inserted into the flow passage through which a refrigerant such as water or oil, the refrigerant is sealed by the seal 1200 provided on the bottom surface of the flange 304B. Therefore, the penetration of a cooling medium into the module case 304 can be prevented by a simple configuration.

Figure 17:
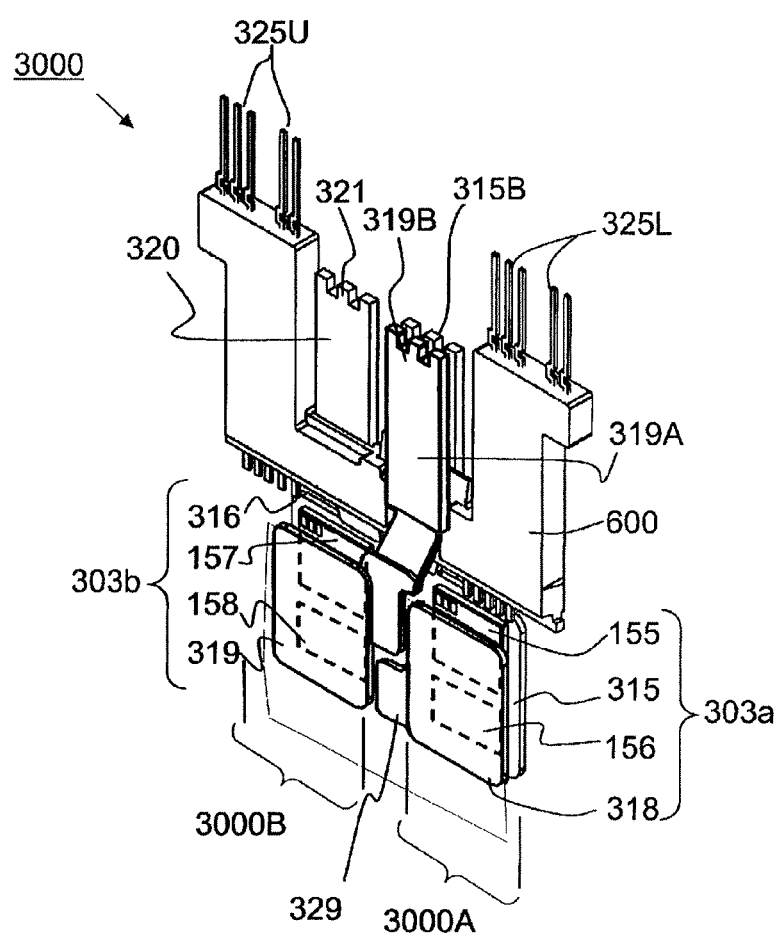
FIG. 17 is an external appearance perspective view of a semiconductor device unit 3000.
Figure 18:
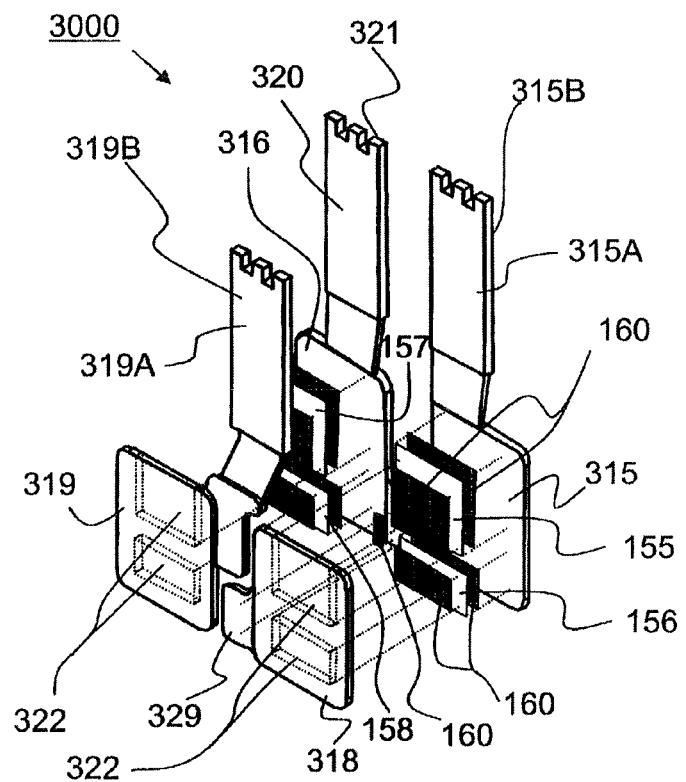
FIG. 18 is an exploded perspective view of the semiconductor device unit 3000.

Next, the semiconductor device unit received in the case 304 will be described with reference to FIGS. 16, 17, 18 and 19. FIG. 17 is a perspective view illustrating an external appearance of the semiconductor device unit 3000 including the upper/lower arm series circuit 150 illustrated in FIG. 16. FIG. 18 is an exploded perspective view of a semiconductor device unit 3000. As described above, the upper/lower arm series circuit 150 includes an IGBT 155 and a diode 156 constituting an upper arm 303a, and an IGBT 157 and a diode 158 constituting a lower arm. In both the IGBT 155 and IGBT 157 and the diodes 156 and 158, electrodes are formed on both sides of a chip.

As illustrated in FIG. 18, a collector electrode of the IGBT 155 and a cathode electrode of the diode 156 are electrically connected to a lead frame (DC positive conductor plate) 315 by a metal joining portion 160. On the other hand, an emitter electrode of the IGBT 155 and an anode electrode of the diode 156 are electrically connected to a lead frame (second AC conductor plate) 318 by the metal joining portion 160. In this way, a semiconductor device block 3000A constituting the upper arm 303a is formed by disposing the IGBT 155 and the diode 156 between the lead frame 315 and the lead frame 318, which are disposed to be generally parallel to each other, and joining the electrode formed on both sides of the IGBT 155 and the diode 156 to the lead frames 315 and 318 by the metal joining portion 160.

Likewise, a lead frame (first AC conductor plate) 316 and a lead frame (DC negative conductor plate) 319 are disposed to be generally parallel to each other. A semiconductor device block 3000B constituting the lower arm 303b is formed by electrically connecting a collector electrode of the IGBT 157 and a cathode electrode of the diode 158 to a lead frame 316 by the metal joining portion 160 and electrically connecting an emitter electrode of the IGBT 157 and an anode electrode of the diode 158 to a lead frame 319 by the metal joining portion 160. Thereafter, a control electrode of the IGBT 155 and the IGBT 157, and a signal terminal 325U and a signal terminal 325L are electrically connected by a metal wire 327 (see FIG. 15).

In the lead frame 318 of the upper arm 303a and the lead frame 316 of the lower arm 303b, an intermediate electrode 329 protruding to the side is formed. The upper/lower arm series circuit 150 is formed by connecting the intermediate electrode 329 of the lead frame 318 and the intermediate electrode 329 of the lead frame 316 by the metal joining portion 160. That is, by connecting the respective intermediate electrodes 329, an integrated semiconductor device unit 3000 in which the semiconductor device block 3000A and the semiconductor device block 3000B are connected one another with disposed to be parallel to each other as illustrated in FIG. 17 is formed.

A DC positive interconnection 315A extending upward is integrally formed in the lead frame 315, and a DC positive terminal 315B is formed at a front end of the DC positive interconnection 315A. Likewise, a DC negative interconnection 319A extending upward is integrally formed in the lead frame 319, and a DC negative terminal 319B is formed at a front end of the DC negative interconnection 319A. Further, an AC interconnection 320 extending upward is integrally formed in a first AC electrode lead frame 316, and an AC terminal 321 is formed at a front end of the AC interconnection 320.

The lead frame is formed of Cu, Cu alloy, Al, Al alloy, or the like that has a high thermal conductivity. The metal joining portion 160 is formed of, for example, a soldering material, a low-temperature sintering joining material containing fine metal particles, a conductive adhesive containing fine metal particles, or the like.

Further, although not illustrated in FIG. 17, as illustrated in the power module cross-sectional view of FIG. 15, the control electrode of the IGBT 155 and the IGBT 157, and the signal terminal 325U and the signal terminal 325L are electrically connected by the metal wire 327 (for example, metal wire of Al or Au). Further, in the lead frames 318 and 319, a protrusion portion 322 is formed on the surface facing an IGBT and a diode, and the IGBT and the diode are joined on the protrusion portion 322. Therefore, when sealed by a resin material in a subsequent process, as illustrated in FIG. 15, the resin material is returned into the control electrode of the IGBT or the space between the wire 327 and the emitter electrode, thus securing insulation.

The signal terminal 325U and the signal terminal 325L are integrally formed by an auxiliary mold body 600 formed of a resin material. A portion of the AC interconnection 320 is also molded by the auxiliary mold body 600, so that the signal terminal 325U, the signal terminal 325L, and the AC interconnection 320 are integrated with each other. Further, the DC positive interconnection 315A and the DC negative interconnection 319A face each other while nipping the auxiliary mold body 600 formed of a resin material, and extend upward while being generally parallel to each other. Thermoplastic resin or thermosetting resin having an insulating property is suitable for the resin material used in the auxiliary mold body 600. Accordingly, the insulation between the DC positive interconnection 315A, the DC negative interconnection 319A, the signal terminal 325U and the signal terminal 325L can be secured, and a high-density interconnection can be implemented.

In addition, by disposing the DC positive interconnection 315A and the DC negative interconnection 319A to be generally parallel to each other, currents flowing instantaneously in a switching operation of the power semiconductor device face each other and flow in the reverse direction. Accordingly, the magnetic fields generated from the currents cancel each other, and a low inductance can be implemented by this operation.

Figure 21:
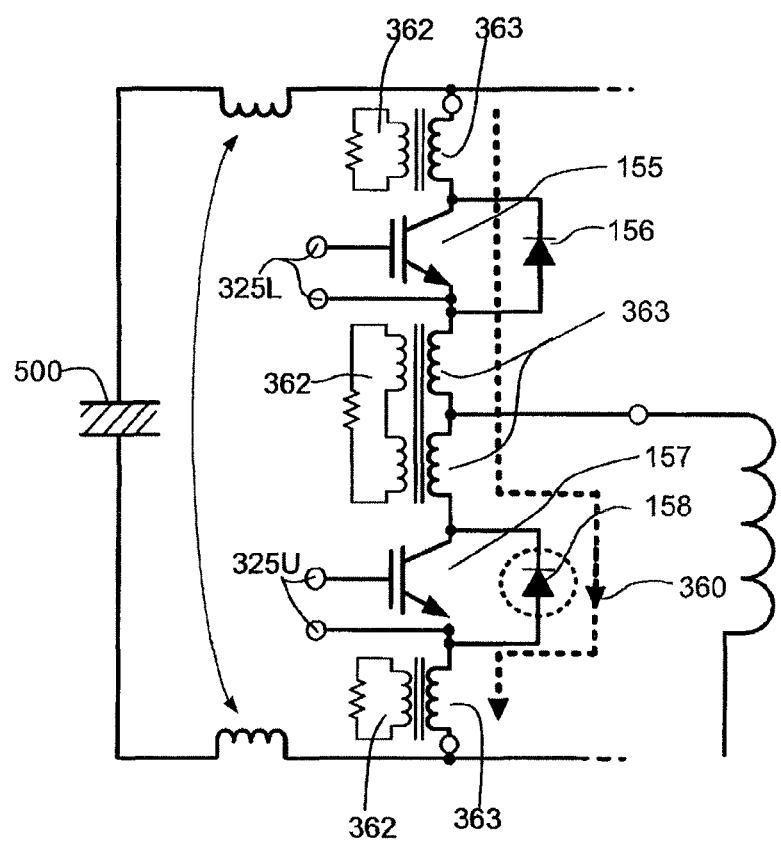
FIG. 21 is a diagram describing a low inductance.
Figure 22:
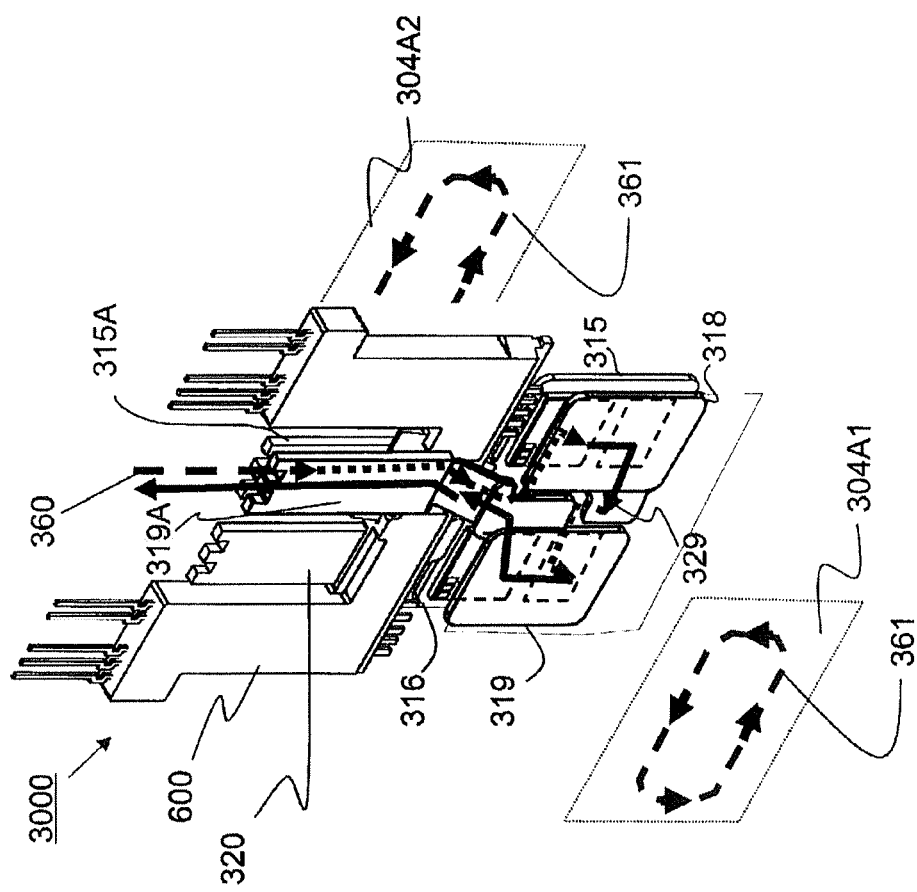
FIG. 22 is a view describing the low inductance.

Herein, the operation of a low inductance will be described with reference to FIGS. 21 and 22. In FIG. 21, the diode 158 of the lower arm side is conducting in a forward bias condition. In this state, when the IGBT 155 of the upper arm side is turned on, the diode 158 of the lower arm side is reverse biased and a recovery current caused by carrier transfer passes through the upper arm and the lower arm. In this case, as represented by a broken line of FIG. 22, a recovery current 360 flows through the respective conductor plates (lead frames) 315, 316, 318 and 319. The recovery current passes through the DC positive interconnection 315A facing the DC negative interconnection 319A, flows through a loop-shaped path formed by the respective lead frames 315, 316, 318 and 319, and flows through the DC negative interconnection 319A facing the DC positive interconnection 315A, as represented by a solid line.

When a current flows through the loop-shaped path, an eddy current 361 flows in the inner periphery of the wall portion 304A2 facing the lead frames 315 and 316 and the wall portion 304A1 facing the lead frames 318 and 319. An interconnection inductance 363 in the loop-shaped path is reduced by the magnetic field cancellation effect generated by an equivalent circuit 362 in the current path of the eddy current 361. Further, as the current path of the recovery current 360 becomes closer to the loop shape, the inductance reduction effect is increased. In this embodiment, as represented by a dotted line, the loop-shaped current path flows through the path close to the side of the DC positive terminal 315B of the lead frame 315, and passes through the IGBT 155 and the diode 156. Then, as represented by a solid line, the loop-shaped current path flows through the path farther from the side of the DC positive terminal 315B of the lead frame 318. Thereafter, as represented by a dotted line, the loop-shaped current path flows through the path farther from the side of the DC positive terminal 3153 of the lead frame 316, and passes through the IGBT 157 and the diode 158. In addition, as represented by a solid line, the loop-shaped current path flows through the path close to the side of the DC negative interconnection 319A of the lead frame 319. In this manner, when the loop-shaped current path passes through the paths close to and farther from the DC positive terminal 315B and the DC negative terminal 319B, a current path closer to the loop shape is formed.

Figure 19:
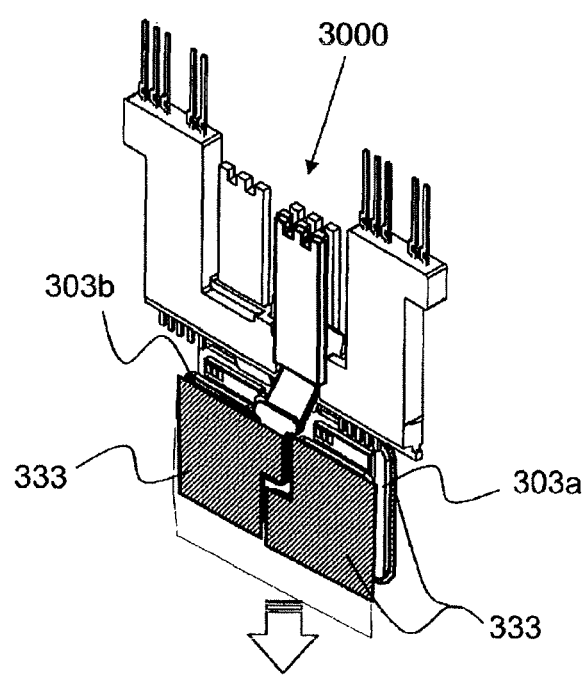
FIG. 19 is an external appearance perspective view of the semiconductor device unit 3000 provided with an insulating sheet 333.

Before the semiconductor device unit 3000 illustrated in FIG. 17 is received in the case 304, an insulating sheet 333 is adhered to the surfaces of the lead frames 316, 317, 318 and 319 as illustrated in FIG. 19. Thereafter, the semiconductor device unit 3000 is inserted into the insertion slot 306 of the case 304 in the direction of an arrow. Further, as illustrated in FIG. 15, a screw fixing screw hole and a through-hole is formed in the auxiliary mold body 600 and the flange 304B of the case 304. Therefore, by fixing the auxiliary mold body 600 to the flange 304B by a screw 309, the semiconductor device unit 3000 can be located at a predetermined position in the case 304, and the assemblability can be improved. Herein, both members are fixed by the screw 309. However, since the location may be determined simply, a concave portion may be formed at one side and a convex portion engaging with the concave portion may be formed on the other side.

FIG. 20(a) is a view illustrating the semiconductor device unit 3000 inserted into the case 304, and illustrates an A-A cross section of FIG. 13. Further, in FIG. 20, the illustration of the fin 305 formed in the outer periphery of the thick heat dissipation portions 307A to 307C is omitted. The semiconductor device block 3000A constituting the upper arm 303a and the semiconductor device block 3000B constituting the lower arm 303b are disposed in parallel in a receiving space 3042 of the case 304. The lead frames illustrated under the semiconductor device blocks 3000A and 3000B face the inner periphery of the thick heat dissipation portion 307C formed in the wall portion 304A2 through the insulating sheet 333.

On the other hand, the lead frame illustrated above the semiconductor device block 3000A faces the inner periphery of the thick heat dissipation portion 307A formed in the wall portion 304A1 through the insulating sheet 333, and the lead frame illustrated above the semiconductor device block 3000B faces the inner periphery of the thick heat dissipation portion 307B formed in the wall portion 304A1 through the insulating sheet 333. The thickness-direction dimension of the receiving space 3042 is set to be larger than the thickness dimension of the semiconductor device blocks 3000A and 3000B. In the state illustrated in FIG. 20(a), a gap is formed between the semiconductor device blocks 3000A and 3000B and the inner periphery of the wall portion 304A1.

When the semiconductor device unit 3000 (semiconductor device blocks 3000A and 3000B) is received in the case 304 as illustrated in FIG. 20(a), the inner periphery of the thick heat dissipation portions 307A and 307B is adhered to the insulating sheet 333 of the facing semiconductor device blocks 3000A and 3000B by deforming the support wall 3041 which has a thin structure by pressing the thick heat dissipation portions 307A and 307B to the case inside direction as illustrated in FIG. 20(b).

Accordingly, the insulation between the lead frames 315, 316, 318 and 319 and the case 304 is secured. In addition, the remaining space of the receiving space 3042 is sealed by a sealing resin 334, and the insulation between the respective electrodes and the case 304 is secured. The thickness of the sealing resin 334 and the insulating sheet 333 is determined by determining the minimum distance necessary for securing the voltage resistance from the breakdown voltage of the sealing resin and the voltages applied between the lead frame 315 and the lead frame 318 and between the lead frame 316 and the lead frame 319.

Further, there is a potting method and a transfer molding method as a method for injecting the sealing resin 334. Examples of the sealing resin 334 include novolak-based resin, multifunctional resin, resin based on biphenyl-based epoxy-based resin, and silicone resin. Ceramics such as $SiO_2$, $Al_2O_3$, AlN and BN, gels, rubber, or the like is contained, and the coefficient of thermal expansion is made to be closer to the case 304 and the lead frames 315, 316, 318 and 319. Accordingly, the difference of coefficient of thermal expansion between the members can be reduced, and the thermal stress caused by a temperature rise in the use environment can be greatly reduced. Therefore, the lifetime of the power module can be increased.

On the other hand, the insulating sheet 333 is made of resin and forms a layer having higher flexibility than ceramics and glass (other insulating materials). In addition, by covering the lead frame together with the sealing resin 334, the generation of a thermal stress can be absorbed by the resin, and the reliability in the case of being used in a vehicle power converter with a severe temperature change can be improved.

The heat generated by conduction of a semiconductor device (chip) transfers to the metal joining portion 160, the lead frames 318 and 319 and then is discharged from the case 304 through the insulating sheet 333 (from the chip surface side), and transfers to the metal joining portion 160, the lead frames 315 and 316 and then is discharged from the case 304 through the insulating sheet 333 (from the chip rear surface side). The insulating sheet 333 is a resin component, and has lower thermal conductivity than the metal joining portion 160, the lead frames 315 and 316, and the module case 304. Therefore, the cooling performance of the power module 300 greatly depends on the thermal resistance of the insulating sheet 333. In the case of a material with low thermal conductivity, since the magnitude of the thermal resistance greatly changes by a thickness change of 10 micrometers, it is most important to control the thickness of the insulating sheet 333.

In this manner, in this embodiment, a plurality of independent thick heat dissipation portions 307A and 307B corresponding to a plurality of semiconductor device blocks 3000A and 3000B is provided, and a flexible support wall 3041 is formed therearound. Accordingly, by forming the support wall 3041 by pressing the thick heat dissipation portions 307A and 307B, the insulating sheet 333 of the semiconductor device block 3000A and the thick heat dissipation portion 307A, and the insulating sheet 333 of the semiconductor device block 3000B and the thick heat dissipation portion 307B can be securely adhered separately.

For example, in the technology described in PTL 1, a thick heat dissipation portion like the thick heat dissipation portion 307C illustrated in FIG. 20 is formed in any one of a pair or wall portions provided in a case. Therefore, when the thickness parallelism is different between the semiconductor device block 3000A and the semiconductor device block 3000B, it is necessary to absorb a thickness variation and a parallelism difference by deforming the insulating sheet 333 when pressing.

However, the insulating property and the heat transfer performance of the insulating sheet 333 depend on the thickness of the insulating sheet 333. Therefore, when the dimension variation and the parallelism variation of a plurality of semiconductor device blocks are absorbed by the deformation of the insulating sheet 333, the insulating performance and the heat transfer performance of the insulating sheet 333 vary between the plurality of semiconductor device blocks. Further, since the dimension variation and the parallelism variation are different between the respective semiconductor device blocks, the insulating sheet 333 needs to have a thickness margin to deal with those variations, therefore it becomes difficult to control the thermal conductivity and the insulating property.

Further, in the conventional structure, when an insulating sheet is adhered at a temperature higher than Tg (glass transition temperature) of a sealing resin, an unevenness or peeling may occur between the resin and the lead frame due to the difference of coefficient of thermal expansion between the sealing resin and the lead frame. When such an unevenness or peeling occurs, the insulating performance is degraded.

In this embodiment, the thick heat dissipation portions 307A and 307B surrounded by the support wall 3041 which has a thin structure are separately provided corresponding to the respective semiconductor device blocks 3000A and 3000B. Therefore, even when the thickness and the parallelism of the semiconductor device blocks 3000A and 3000B are different, the thick heat dissipation portions 307A and 307B can be adhered to the each of the insulating sheet 333 according to the thickness of the insulating sheet 333. As a result, the thickness of the insulating sheet 333 of the respective semiconductor device blocks 3000A and 3000B can be uniform according to a design value, the thickness of the insulating sheet 333 can be designed to the minimum thickness capable of securing the voltage resistance, and the thermal resistance can be reduced easily.

Further, in this embodiment, the sealing resin 334 is filled after the insulating sheet 333 is adhered to the lead frame and the case 304. Therefore, the temperature influence in the adhesion of the insulating sheet can be prevented.

Further, although the thick heat dissipation portions 307A and 307B and the support wall 3041 are formed in the wall portion 304A1 in the example illustrated in FIG. 13, they may also be formed in the opposite wall portion 304A2. In addition, the thick heat dissipation portions 307A and 307B and the support wall 3041 which has a thin structure may be formed in both of the wall portions 304A1 and 304A2.

[Modification 1]

Figure 23:
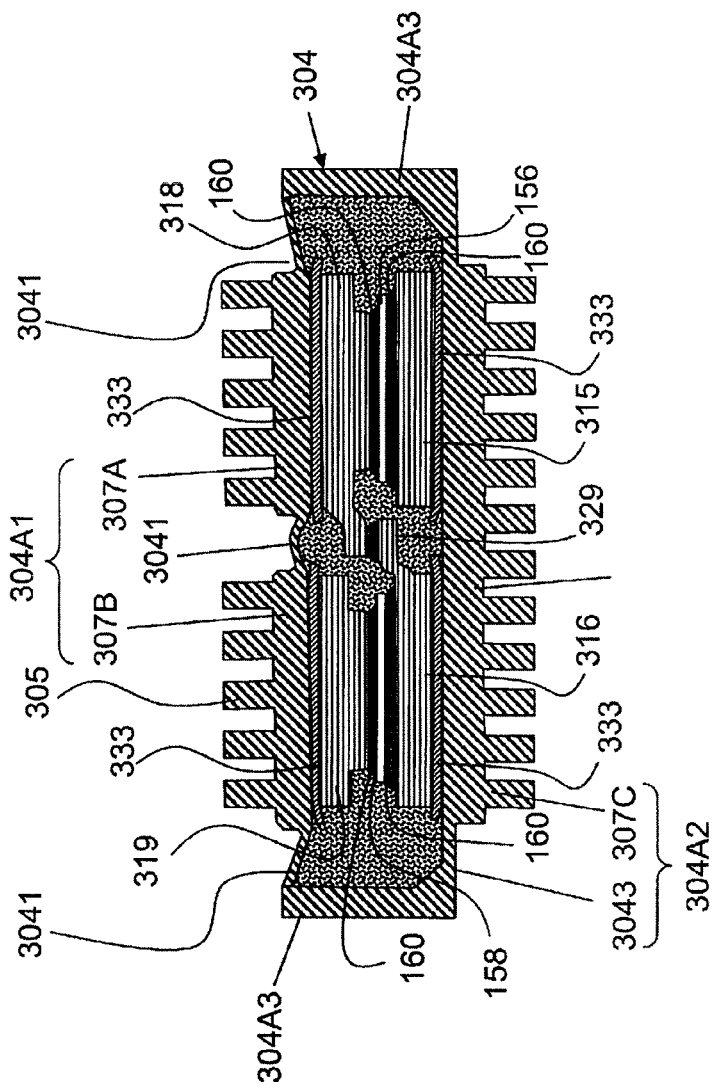
FIG. 23 is a view describing a modification 1.

FIG. 23 illustrates a modification of the structure of the lead frame, the insulating sheet and the sealing resin according to the above-described embodiment. FIG. 23 is the same cross-sectional view as FIG. 14, but FIG. 23 illustrates a cross section of a portion passing a portion of the intermediate electrode 329. As illustrated in FIG. 23, the intermediate electrode 329 corresponds to a connection portion of the lead frame 316 constituting the upper arm 301a and the lead frame 318 constituting the lower arm 301b. Since a chip (semiconductor device) as a heating source is not mounted in this region, the insulating sheet 333 of high heat dissipation needs not be adhered, and the insulation may be secured by the sealing resin 334.

Therefore, the intermediate electrode 329 is bent to be farther from the wall portions 304A1 and 304A2, and the sealing resin 334 is made to be easily filled into the gap between the intermediate electrode 329 and the wall portions 304A1 and 304A2 in which the insulating sheet 333 is not provided. As a result, voids are hardly formed, and the flexibility of the process condition and the type of the sealing resin 334 used can be increased. In addition, the shape of the insulating sheet 333 can be changed from the shape illustrated in FIG. 19 into a rectangular shape, and the assemblability is improved.

Further, the intermediate electrode 329 is herein described as an example. However, the invention can also be applied to a lead frames except for the surface mounting chips, such as bus bar. By performing a bending process and pressing operation on their points, and by increasing the distance from the case 304 and providing non-contact with the insulating sheet 333, the sealing resin 334 can be easily filled and the assemblability can be improved.

[Modification 2]

The end portions of the lead frames 315, 316, 318 and 319 are apt to undergo an electric field concentration, and thus require higher insulation than other regions. In the modification 2, a structure for suppressing such an electric field concentration will be described. In the example illustrated in FIG. 24, by performing processes (for example, pressing, tapering, bending, and cutting) on the end portions of the lead frames 315, 316, 318 and 319, the distance between the end portion of the lead frame and the inner periphery of the case 304 is increased, and the insulation reliability is improved by a creepage distance increase.

Figure 24:
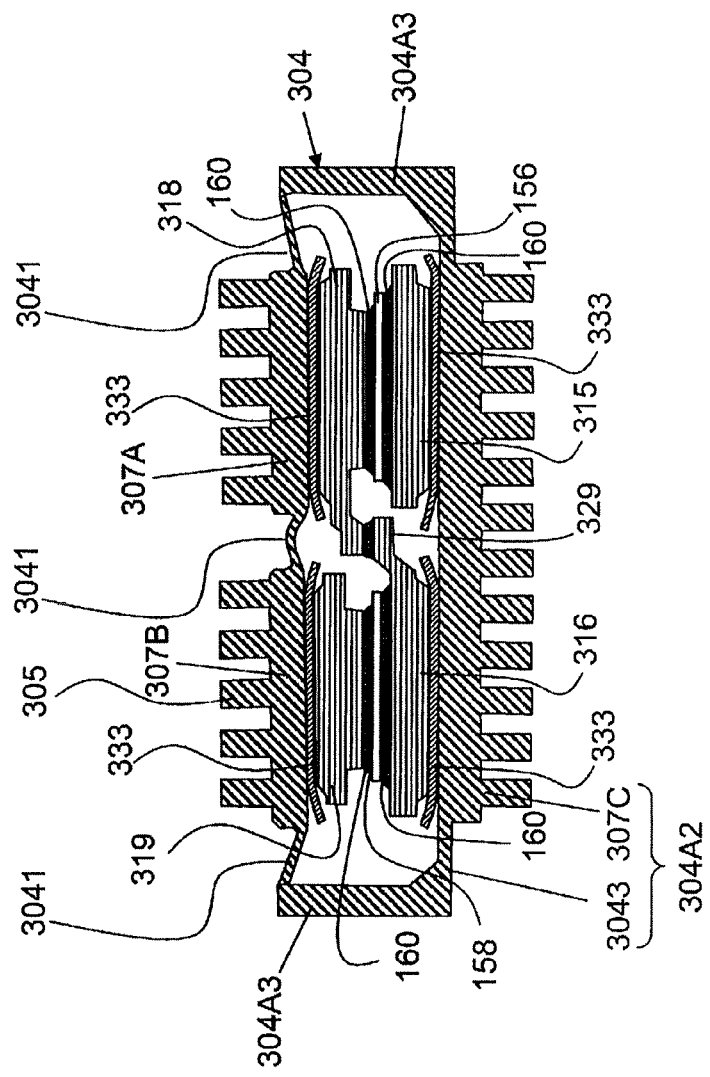
FIG. 24 is a view describing a modification 2.

FIG. 25(a) is a view describing the shape of the end portion of the lead frame 319. Three types of shapes are illustrated sequentially from the left side. A broken line represents a conventional shape. By cutting or pressing a portion represented by the broken line, a taper 3190 or a step shape 3191 is formed as represented by a solid line. The shape illustrated in the right side is a combination of the taper 3190 and the step shape. FIG. 24 illustrates the state before injection of the sealing resin 334. However, the sealing resin 334 is filled into a large gap at the end portion of the lead frame. A greater thermal stress is applied to the end portion of the lead frame than to other regions. However, the contact area with the sealing resin 334 is increased by this end portion processing, and the peeling resistance of the sealing resin 334 at the end portion of the lead frame can be improved.

Figure 26:
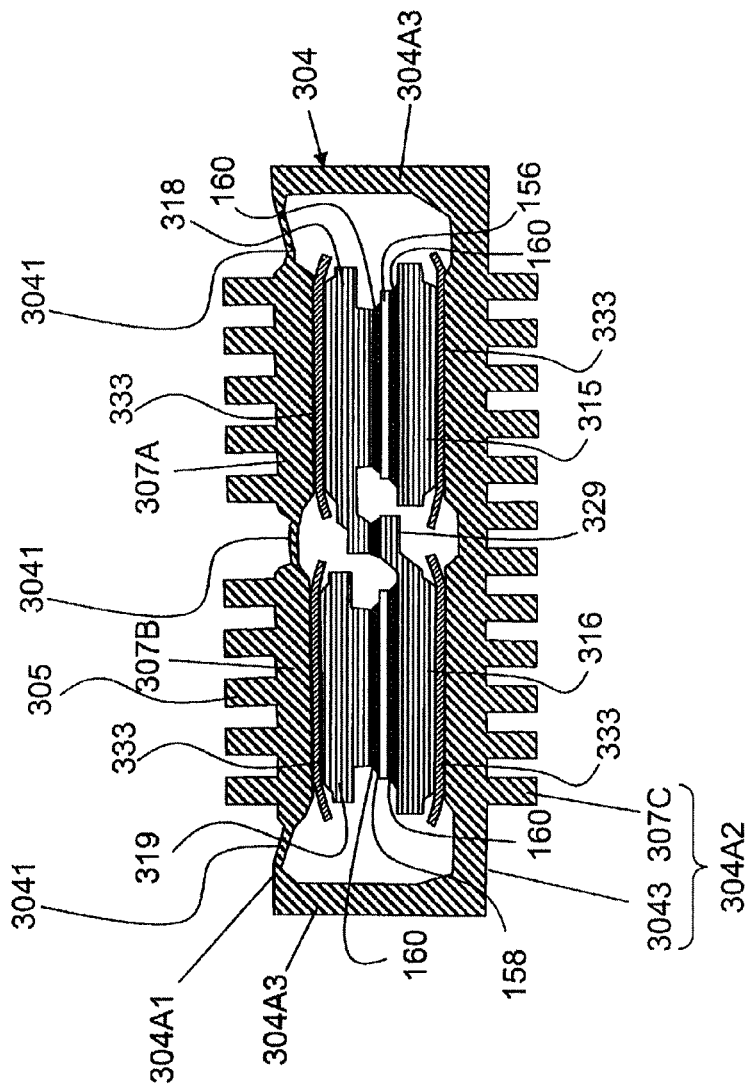
FIG. 26 is a view describing the shape of an inner periphery of the case 304.

In the example illustrated in FIG. 26, a taper 3190 is formed at the end portion of the lead frame, and the shape of the inner periphery of the case 304 is changed such that the filling volume of the sealing resin 334 between the end portion of the lead frame and the inner periphery of the case is increased. FIG. 25 (b) is an enlarged view of the end portion of the lead frame 316 illustrated in FIG. 26. In the inner periphery of the wall portion 304A2 of the case 304, a region facing the lead frame 316 protrudes, and a taper 3192 is formed at the end portion of the protrusion portion 3044. By this shape, the filling volume of the sealing resin 334 between the end portion of the lead frame and the inner periphery of the case can be further increased, and the sealing resin 334 can be easily filled, thereby improving the assemblability.

Further, in the structure of this embodiment, a process for improving the reliability of the adhering surface between the insulating sheet 333 and the lead frames 315, 316, 318 and 319 can be performed before the chip is mounted. Examples of the method include physical roughening such as sandblasting, a chemical etching method using acid or alkali solution, and an anodic oxidation method.

[Modification 3]

In this embodiment, since the case 304 has a watertight structure, liquid surface treatment can be easily performed.

For example, applying a low Young's modulus polyamide resin, the adhesion strength between the inner surface and the side surface of the lead frame, the chip, and the metal joining portion 160 can be improved. In this case, there is a problem in that when the polyamide resin is adhered to the adhesive surface of the insulating resin of the lead frame, a thermal resistance increases greatly. In this embodiment, the above problem can be easily solved by injecting the polyamide resin 335 and vibrating the case 304 after adhering the insulating sheet 333.

Figure 27:
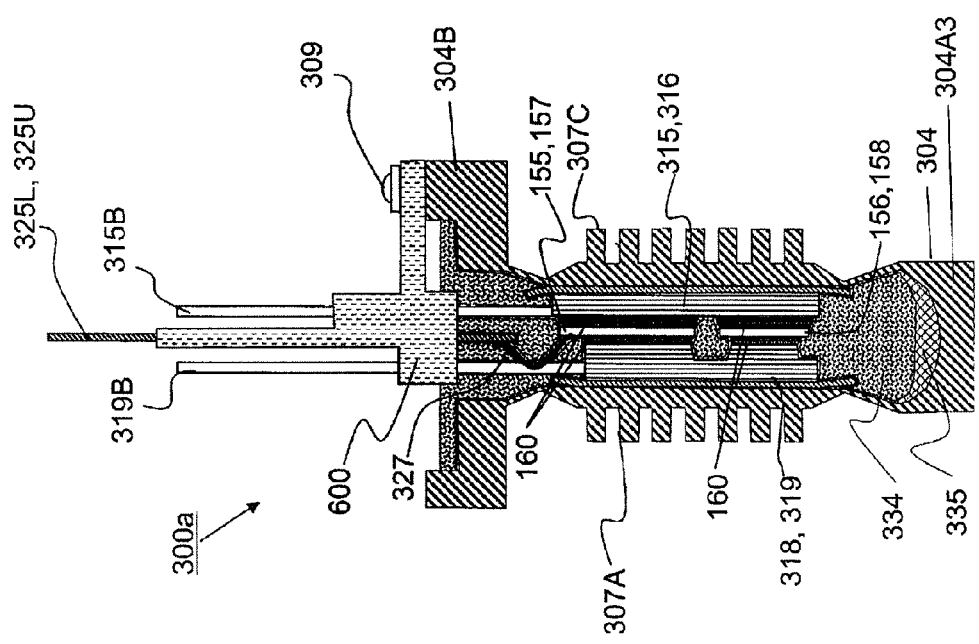
FIG. 27 is a view describing a modification 3.

Further, as compared to other portions, the bottom portion of the module case 304 (which is a dead-end structure) has a larger sealing volume and is apt to receive a peeling stress due to the cure shrinkage of the sealing resin 334. Therefore, after injecting the polyamide resin 335 and vibrating the case 304, while maintaining the case 304 to be vertical as illustrated in FIG. 27, the polyamide resin 335 of the bottom portion of the case 304 is formed to be thick. After drying the polyamide resin 335, the sealing resin 334 is injected and cured. By vibrating the case 304 after injecting the polyamide resin 335, the polyamide resin 335 is adhered to the entire portion including the side surface as well as the bottom portion. In this manner, by disposing the low Young's modulus polyamide resin 335 at the bottom portion, a stress caused by the cure shrinkage of the sealing resin 334 can be absorbed.

In the above-described embodiment, one pair of upper/lower arms 303a and 303b are received in the case 304. That is, a description has been made of the case where two semiconductor device blocks 3000A and 3000B are received in the case 304. However, the number of semiconductor device blocks received in the case 304 is not limited to two.

Figure 28:
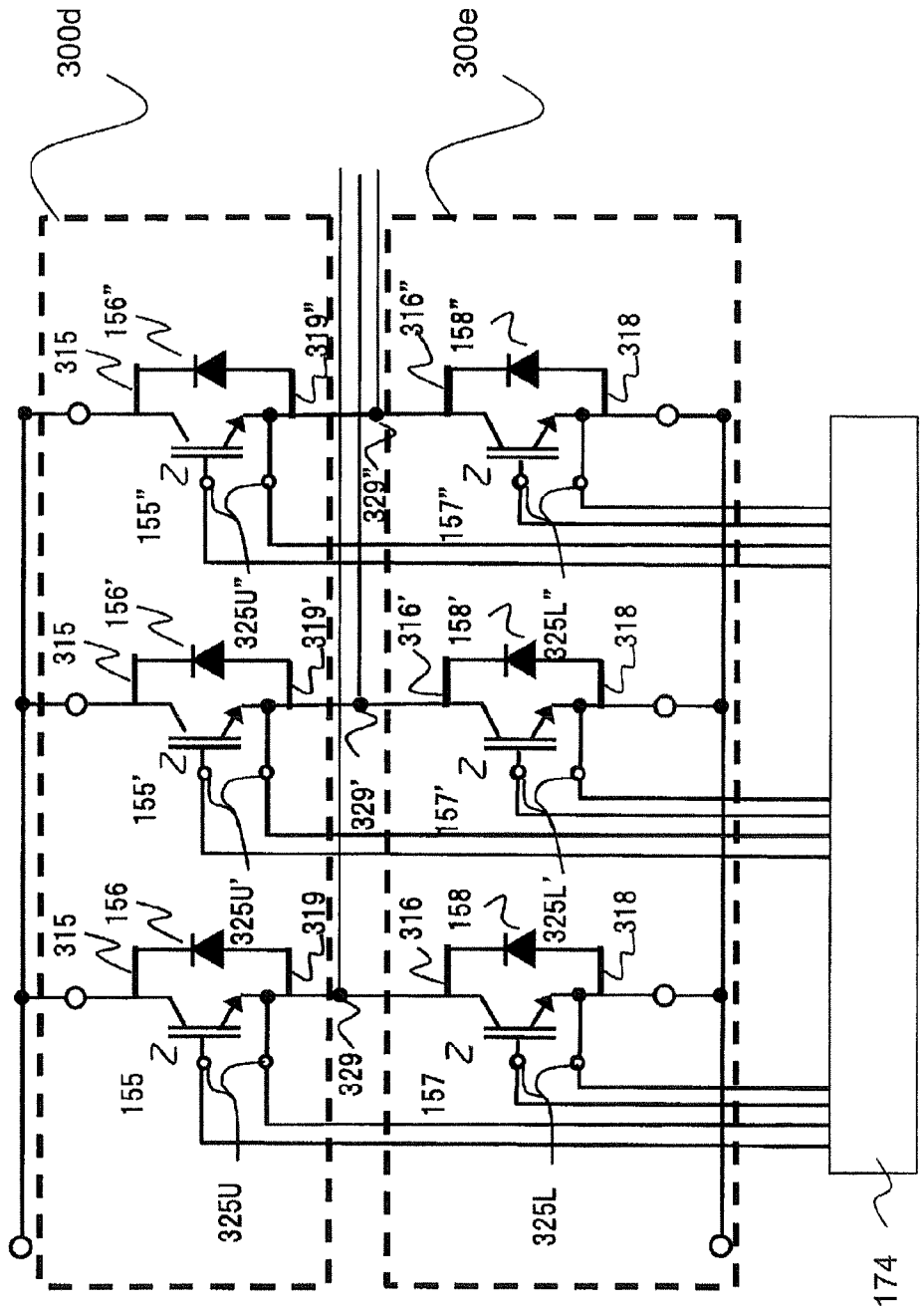
FIG. 28 is a circuit diagram describing the power module including three semiconductor device blocks.
Figure 29:
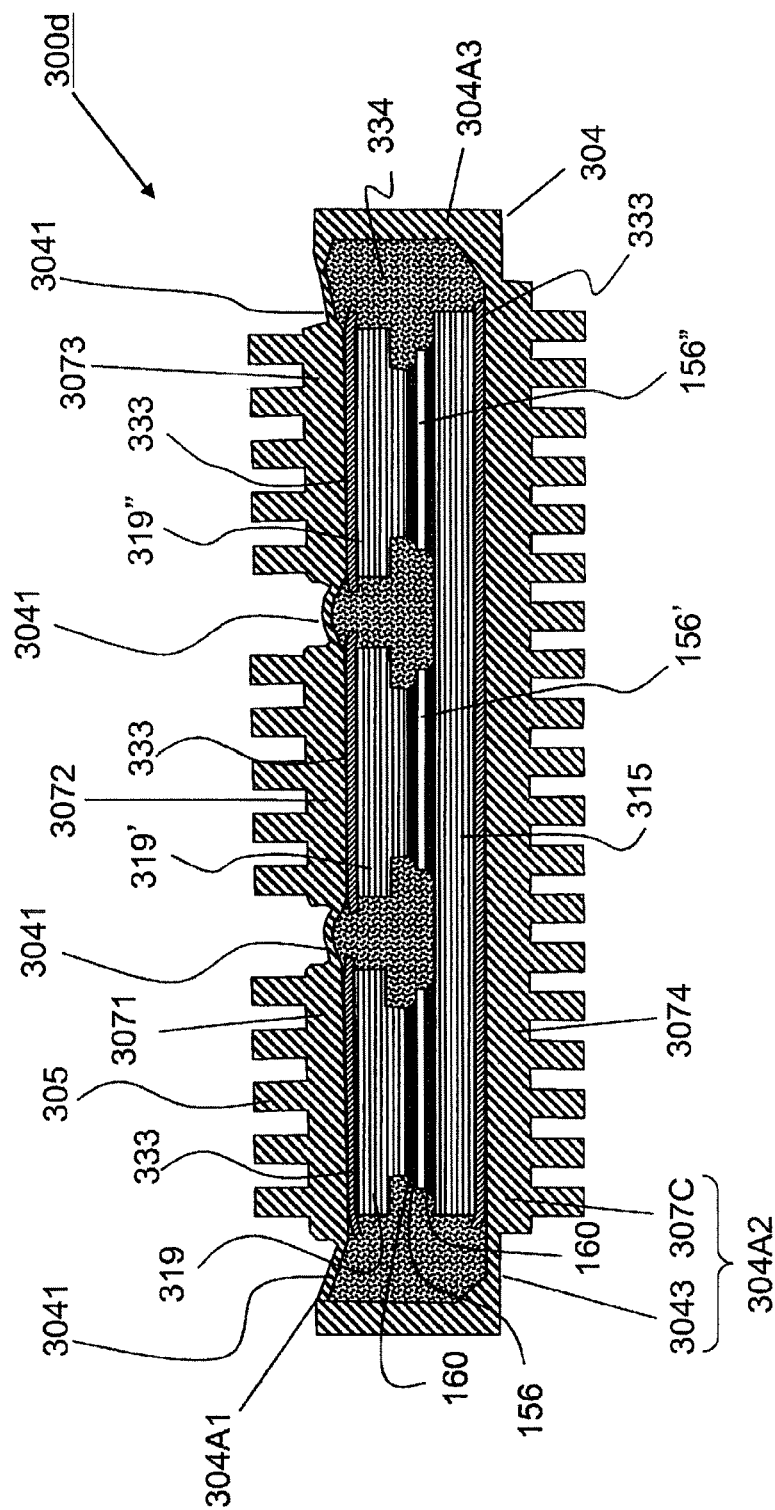
FIG. 29 is a cross-sectional view of a power module 300d.
Figure 30:
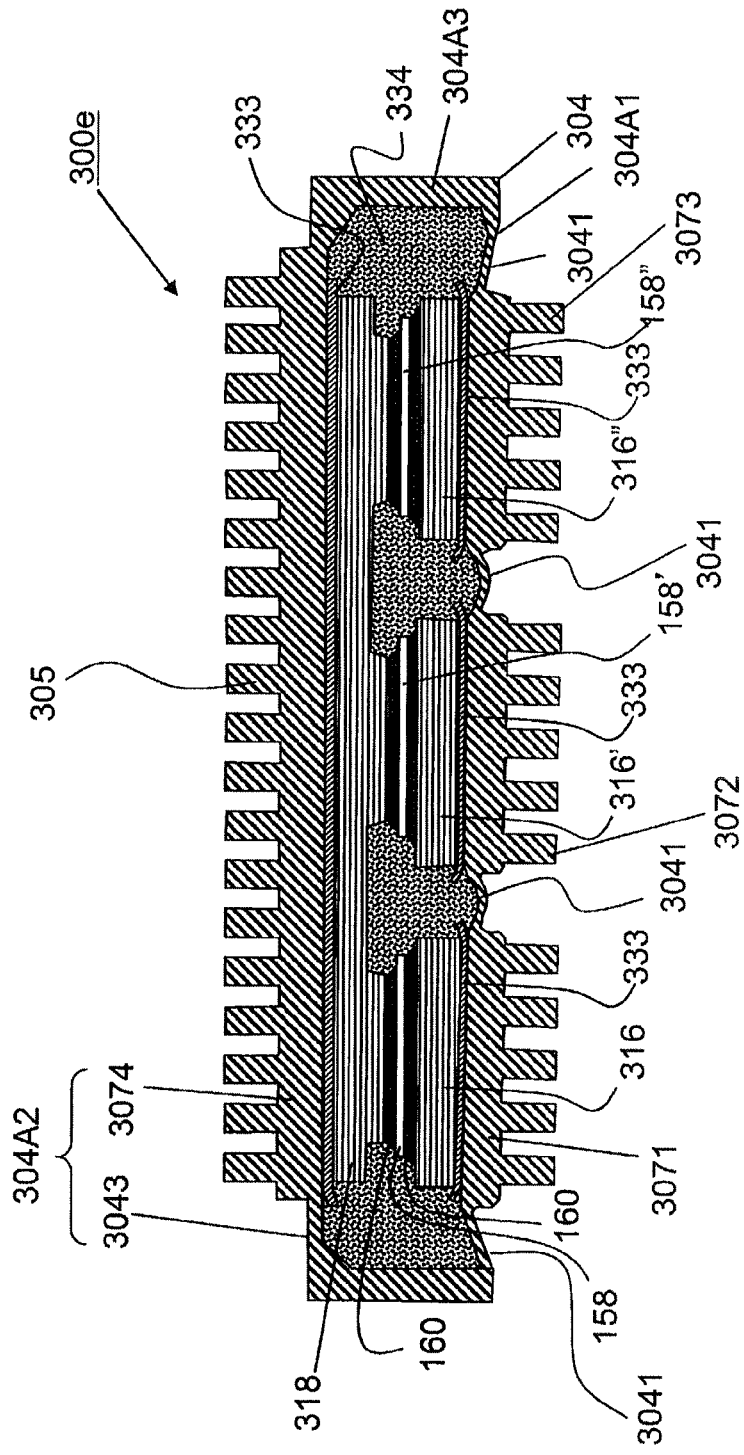
FIG. 30 is a cross-sectional view of a power module 300e.

FIGS. 28 to 30 illustrate the case of inserting three semiconductor device blocks into the case 304. In this case, as illustrated in circuit diagram in FIG. 28, the inverter circuit 144 of FIG. 2 is configured to include a power module 300d in which three upper arms are connected in parallel, and a power module 300e in which three lower arms are connected in parallel.

FIG. 29 illustrates the power module 300d in which one lead frame 315 and three lead frames 319, 319' and 319" are disposed to be generally parallel to each other. Cathode electrodes of diodes 156, 156' and 156" are electrically connected to the lead frame 315 by the metal joining portion 160. Anode electrodes of the diodes 156, 156' and 156" are electrically connected to the respective lead frames 319, 319' and 319" by the metal joining portion 160.

Further, collector electrodes of IGBTs 155, 155' and 156" are electrically connected to the lead frame 315 by the metal joining portion 160. Emitter electrodes of the IGBTs 155, 155' and 155" are electrically connected to the respective lead frames 319, 319' and 319" by the metal joining portion 160 (not illustrated), and signal terminals 325U, 325U' and 325U" of the IGBTs 155, 155' and 155" are electrically connected to the respective lead frames 319, 319' and 319" by the metal wire 327 (not illustrated).

The lead frames 315, 319, 319' and 319" are joined to the case 304 respectively through the insulating sheet 333. In this case, the respective blocks including the respective lead frames 319, 319' and 319" constitute the respective semiconductor device blocks. Three thick heat dissipation portions 3071 to 3073 corresponding to the lead frames 319, 319' and 319", and the support wall 3041 surrounding the thick heat dissipation portions 3071 to 3073 are formed in the wall portion 304A1 to which the lead frames 319, 319' and 319" are joined. On the other hand, one thick heat dissipation portion 3074 corresponding to the lead frame 315 is formed in the wall portion 304A2 to which the lead frame 315 is joined.

In this manner, since the support wall 3041 is formed to surround the thick heat dissipation portions 3071 to 3073, the thick heat dissipation portions 3071 to 3073 can be joined according to the inclination angles of the respective lead frames 319, 319' and 319" and the thickness of the insulating sheet 333. The remaining clearance space including a gap between the lead frames 315, 319, 319' and 319" is sealed by the sealing resin 334, thus securing the insulation between the respective conductive members.

FIG. 30 illustrates the power module 300e in which one lead frame 318 and three lead frames 316, 316' and 316" are disposed to be generally parallel to each other. Cathode electrodes of diodes 158, 158' and 158" are electrically connected to the respective lead frames 316, 316' and 316" by the metal joining portion 160. Anode electrodes of the diodes 158, 158' and 158" are electrically connected to the lead frame 318 by the metal joining portion 160.

Further, collector electrodes of IGBTs 157, 157' and 157" are electrically connected to the respective lead frames 316, 316' and 316" by the metal joining portion 160. Emitter electrodes of the IGBTs 157, 157' and 157" are electrically connected to the lead frame 318 by the metal joining portion 160 (not illustrated). Signal terminals 325L, 325L' and 325L" of the IGBTs 157, 157' and 157" are electrically connected to the lead frames by the metal wire 327 (not illustrated).

The lead frames 316, 316', 316" and 318 are joined to the case 304 respectively through the insulating sheet 333. In this case, the respective blocks including the respective lead frames 316, 316' and 316" constitute the respective semiconductor device blocks. Three thick heat dissipation portions 3071 to 3073 corresponding to the lead frames 316, 316' and 316", and the support wall 3041 surrounding the thick heat dissipation portions 3071 to 3073 are formed in the wall portion 304A1 to which the lead frames 316, 316' and 316" are joined. On the other hand, one thick heat dissipation portion 3074 corresponding to the lead frame 318 is formed in the wall portion 304A2 to which the lead frame 318 is joined.

Therefore, the thick heat dissipation portions 3071 to 3073 can be joined according to the inclination angles of the respective lead frames 316, 316' and 316" and the thickness of the insulating sheet 333. The remaining clearance space including a gap between the lead frames 316, 316', 316" and 318' is sealed by the sealing resin 334, thus securing the insulation between the respective conductive members.

In the power module 300d, the lead frames 315, 319, 319' and 319" are extracted as terminals from the case 304 to the outside, and in the power module 300e, the lead frames 318, 316, 316' and 316" are extracted as terminals from the case 304 to the outside. The lead frames 316 and 319, the lead frames 316' and 319', and the lead frames 316" and 319" are electrically connected outside the case. The upper/lower arm series circuit is formed by this connection. In this case, since the lead frame 315 and the lead frame 318 can be formed in one plane, the chip can be easily mounted. Further, the number of cases 304 can be reduced to two.

Figure 31:
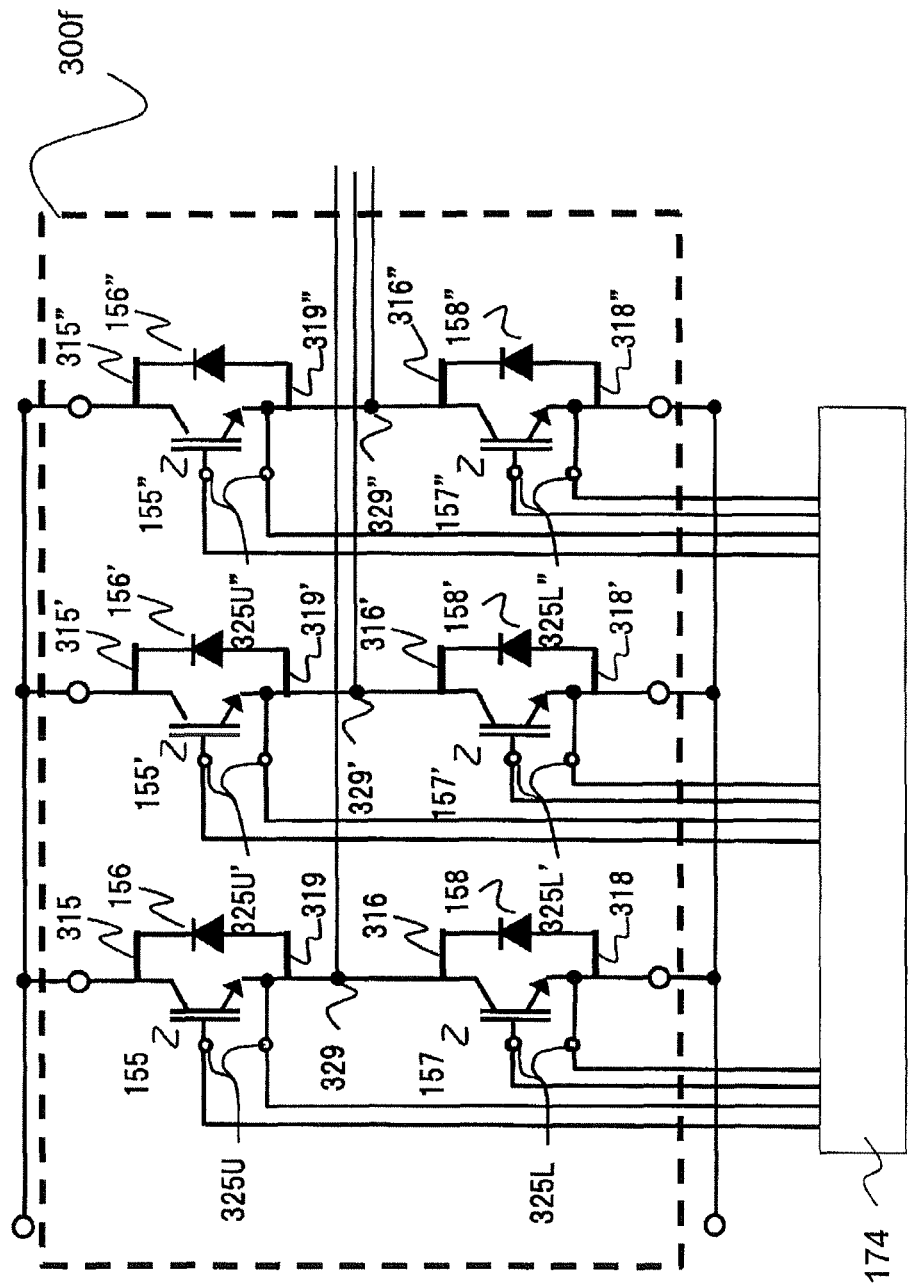
FIG. 31 is a circuit diagram describing the power module including six semiconductor device blocks.
Figure 32:
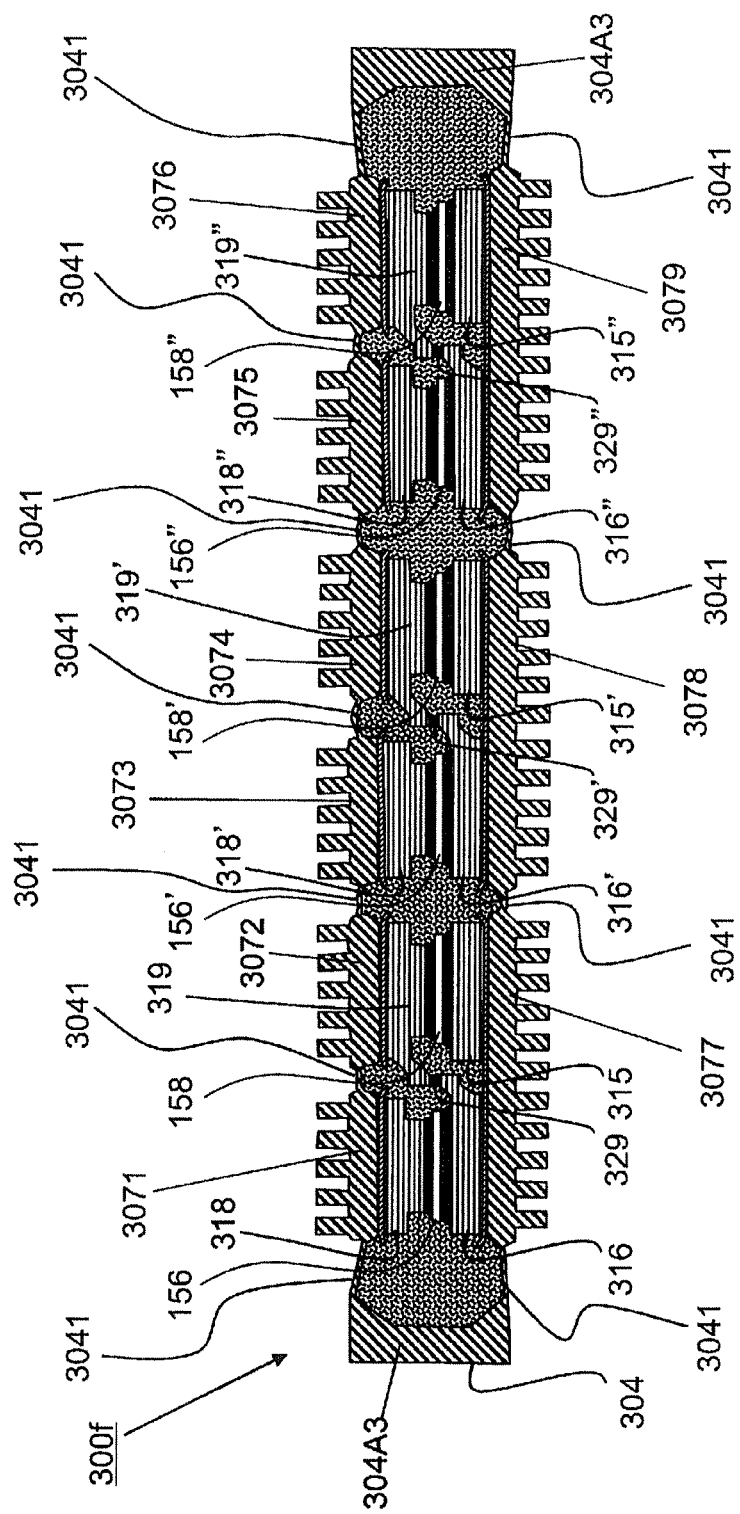
FIG. 32 is a cross-sectional view of a power module 300f.

FIGS. 31 and 32 illustrate the case of inserting six semiconductor device blocks into the case 304. In this case, as illustrated in FIG. 31, one power module 300f is constructed by receiving six upper/lower arms into one case 304. That is, three semiconductor device units corresponding to the upper/lower arm series circuit 150 illustrated in FIGS. 13 to 17 are disposed in parallel in the case. In other words, six semiconductor device blocks constituting three semiconductor device units are disposed in parallel in the case 304.

The IGBT 155 and the diode 156 are electrically connected between the lead frames 315 and 319 through the metal joining portion 160, and the IGBT 157 and the diode 158 are electrically connected between the lead frames 316 and 318 through the metal joining portion 160. Further, the lead frames 316 and 319 are electrically connected through the metal joining portion 160 (intermediate electrode 329) to form an upper/lower arm series circuit. Likewise, the IGBT 155' and the diode 156' are electrically connected between the lead frames 315' and 319' through the metal joining portion 160, and the IGBT 157' and the diode 158' are electrically connected between the lead frames 316' and 318' through the metal joining portion 160. Further, the lead frames 316' and 319' are electrically connected through the metal joining portion 160 (intermediate electrode 329') to form an upper/lower arm series circuit. The IGBT 155" and the diode 156" are electrically connected between the lead frames 315" and 319" through the metal joining portion 160, and the IGBT 157" and the diode 158" are electrically connected between the lead frames 316" and 318" through the metal joining portion 160. Further, the lead frames 316" and 319" are electrically connected through the metal joining portion 160 (intermediate electrode 329") to form an upper/lower arm series circuit.

In the case 304, thick heat dissipation portions 3071 to 3076 are formed to face the lead frames 318, 319, 318', 319', 318" and 319"', and thick heat dissipation portions 3077 to 3079 are formed to face the lead frames 316, 315, 316', 315', 316" and 315"'. In addition, the support wall 3041 is formed to surround the respective thick heat dissipation portions 3071 to 3079. Therefore, the respective thick heat dissipation portions 3071 to 3079 can be joined according to the thickness and the inclination angle of the insulating sheet 333 joined. Further, the remaining clearance space therebetween is sealed by the sealing resin 334, thus securing the insulation between the respective conductive members.

Further, since there is a point where the support wall 3041 is formed at a vertically symmetrical position, a region in which a plurality of thick heat dissipation portions is formed can be entirely deformed before sealing by the sealing resin 334. For example, the case 304 may deform to a generally curved shape. In the case of power module illustrated in FIGS. 31 and 32, the number of cases 304 can be reduced to one and the case 304 can be flexibly bent as described above. Therefore, the miniaturization of the inverter can be achieved.

Although various embodiments and modifications have been described above, the respective embodiments may be used independently or in combination. This is because the effects of the respective embodiments can be provided independently or synergistically. Further, unless the features of the invention are damaged, the invention is not at all limited to the above embodiments. Other embodiments conceivable within the spirit and scope of the invention are to be included in the scope of the invention.

The invention claimed is:
1. A semiconductor module comprising:
  a case including a receiving space which is formed by a frame portion and a pair of wall portions disposed to face each other with the frame portion therebetween, the pair of wall portions including a heat dissipation portion and a support wall which supports the heat dissipation portion at the frame portion;
  a plurality of semiconductor device blocks which are disposed in parallel in the receiving space while facing the wall portion, wherein a conductor plate is joined to each of electrode surfaces formed at both sides of a semiconductor device;
  a plurality of insulating sheet members which are respectively interposed between the respective conductor plates and an inner periphery of the wall portion to insulate the respective conductor plates and the inner periphery of the wall portion; and a resin composition member which is filled in the receiving space to seal the plurality of semiconductor device blocks, wherein the heat dissipation portion provided on at least one side of the wall portion includes a plurality of separate heat dissipation portions disposed to face the plurality of semiconductor device blocks respectively, and the plurality of separate heat dissipation portions is surrounded by the support wall, the support wall is deformed to be recessed from the frame portion through the separate heat dissipation portion inside the case such that the plurality of insulating sheet members is closely joined to the plurality of conductor plates and the plurality of separate heat dissipation portions respectively.

2. The semiconductor module according to claim 1, wherein
the conductor plate includes a connection portion which is bent and formed a semiconductor device side and is connected to the conductor plate of the other semiconductor device blocks disposed in parallel.

3. The semiconductor module according to claim 1, wherein
the conductor plate has an inclined surface or an uneven surface formed at an end portion of a surface facing the insulating sheet member, and
the resin composition member is filled into a gap between the inclined surface or the uneven surface and the insulating sheet member.

4. The semiconductor module according to claim 1, wherein
a thermal conductivity of the insulating sheet member is higher than a thermal conductivity of the resin composition member.

5. The semiconductor module according to claim 1, wherein
a polyamide resin layer is formed between the semiconductor device block, the insulating sheet member, the inner periphery of the case, and the resin composition member.

6. The semiconductor module according to claim 1, comprising:
a position determining unit which determines a position of the plurality of semiconductor device blocks in the receiving space.

7. A method for manufacturing the semiconductor module according to claim 1, comprising:
fixing the insulating sheet member to the conductor plate provided in the semiconductor device block;
disposing the plurality of semiconductor device blocks, to which the insulating sheet member is fixed, in parallel in the receiving space such that the insulating sheet member faces the corresponding separate heat dissipation portion;
pressing each of the separate heat dissipation portions toward the inside of the case to deform the support wall and join the separate heat dissipation portion closely to the insulating sheet member; and
filling the resin composition member into the receiving space to seal the plurality of semiconductor device blocks.

8. The method according to claim 7, wherein
after deforming the support wall and joining the separate heat dissipation portion closely to the insulating sheet member,
the polyamide resin layer is formed by attaching a polyamide resin to the inner periphery of the case and the plurality of semiconductor device blocks received in the receiving space, and
the plurality of semiconductor device blocks is sealed by filling the resin composition member into the receiving space.

* * * * *